(12) United States Patent
White

(10) Patent No.: US 9,711,318 B2
(45) Date of Patent: Jul. 18, 2017

(54) RIBBON BEAM ION SOURCE OF ARBITRARY LENGTH

(71) Applicant: Nicholas R. White, Manchester, MA (US)

(72) Inventor: Nicholas R. White, Manchester, MA (US)

( * ) Notice: Subject to any disclaimer, the term of this patent is extended or adjusted under 35 U.S.C. 154(b) by 0 days.

(21) Appl. No.: 14/392,407

(22) PCT Filed: Nov. 26, 2014

(86) PCT No.: PCT/US2014/000216
§ 371 (c)(1),
(2) Date: May 26, 2016

(87) PCT Pub. No.: WO2015/094381
PCT Pub. Date: Jun. 25, 2015

(65) Prior Publication Data
US 2017/0110282 A1    Apr. 20, 2017

Related U.S. Application Data

(60) Provisional application No. 61/964,001, filed on Dec. 20, 2013.

(51) Int. Cl.
| | |
|---|---|
| *H01J 37/08* | (2006.01) |
| *H01J 37/06* | (2006.01) |
| *H01J 27/14* | (2006.01) |
| *H01J 37/317* | (2006.01) |

(52) U.S. Cl.
CPC ............. *H01J 27/14* (2013.01); *H01J 37/08* (2013.01); *H01J 37/3171* (2013.01); *H01J 2237/061* (2013.01)

(58) Field of Classification Search
CPC ........ H01J 27/14; H01J 37/08; H01J 37/3171; H01J 2237/061
See application file for complete search history.

(56) References Cited

U.S. PATENT DOCUMENTS

| | | | | |
|---|---|---|---|---|
| 2003/0205680 | A1* | 11/2003 | Benveniste | H01J 37/08 250/423 R |
| 2005/0258380 | A1* | 11/2005 | White | H01J 37/05 250/492.21 |

* cited by examiner

*Primary Examiner* — Nicole Ippolito
*Assistant Examiner* — Sean Luck
(74) *Attorney, Agent, or Firm* — David Prashker, Esq.

(57) ABSTRACT

The invention is a unique and substantive improvement in ion source assemblies which is able to produce a ribbon-shaped ion beam having an arbitrarily chosen breadth dimension which is at least ten times greater [and often more than thirty times greater] than its thickness dimension, the breadth and thickness dimensions of the beam being normal (i.e., perpendicular) to the Z-axis direction of travel for the ion beam. In all its embodiments, the improved ion source will comprise not less than two discrete component parts: (i) A closed, solid wall, prism-shaped arc discharge chamber having limited width and depth dimensions, and which concurrently has an arbitrarily chosen and predetermined length dimension which can be as small as 80 millimeters and alternatively exceed 3,000 millimeters in size; and (ii) A primary electron trap assembly which comprises at least an adjacently located magnetic field generating yoke subassembly able to provide a discernible quadrupole magnetic field internally within a confined cavity volume existing within the measurable dimensions of the arc discharge chamber walls.

17 Claims, 15 Drawing Sheets

Lines of magnetic flux, B.

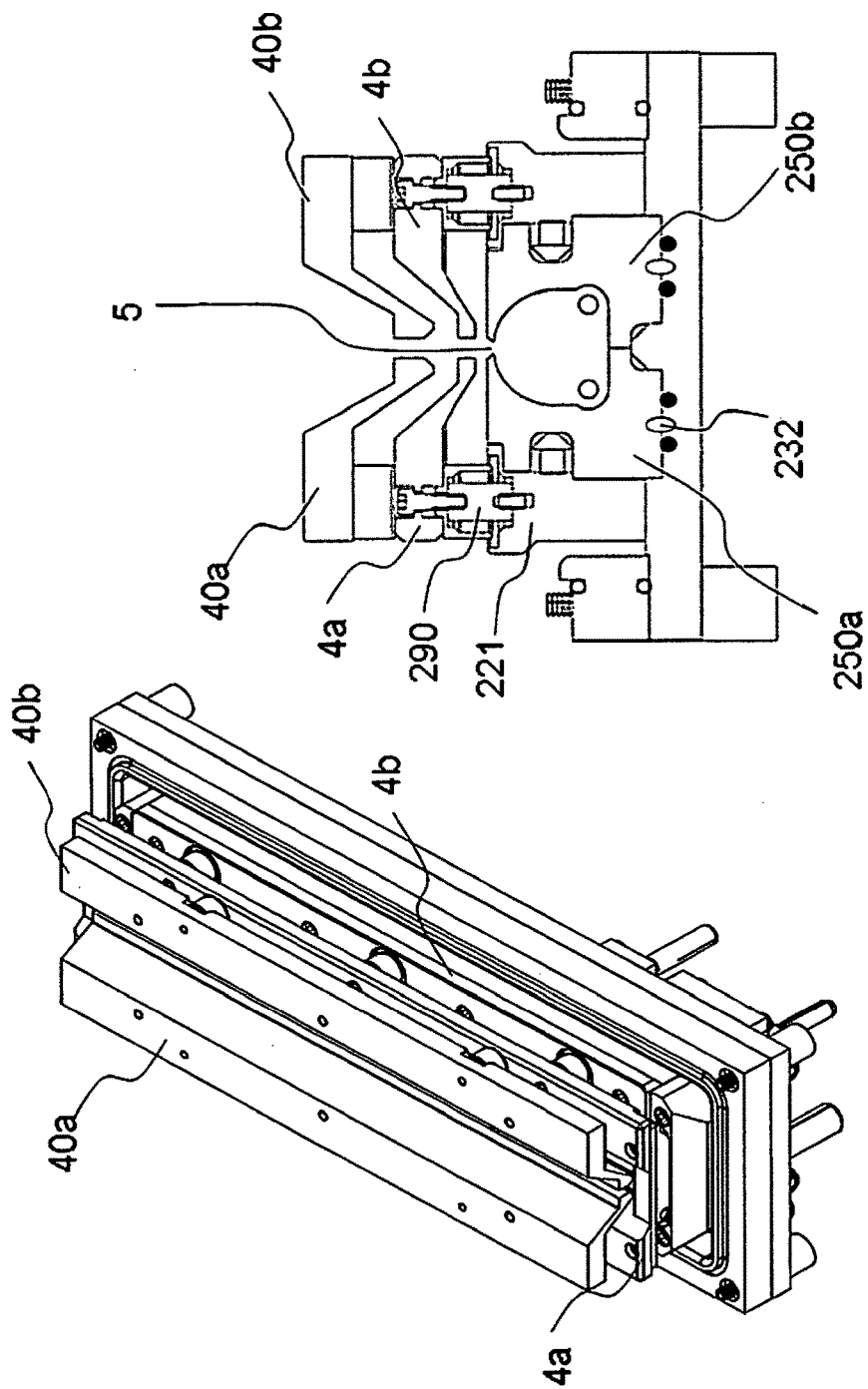

Magnetic contour lines with field strengths in Gauss

RIBBON BEAM ION SOURCE OF ARBITRARY LENGTH

PRIORITY CLAIM

The present invention was first filed as U.S. Provisional Patent Application Ser. No. 61/964,001 on Dec. 20, 2013. The legal benefits and advantages of this first filing are expressly claimed herein.

FIELD OF THE INVENTION

The present invention is concerned generally with the generation of surprisingly broad breadth, high current, ribbon-shaped ion beams. Such broad breadth beams can be used in ion implantation systems to dope semiconductors with preselected ion species for integrated circuit manufacturing, for flat-panel display manufacturing for LCD and OLED displays, as well as for photovoltaic manufacturing; and they can be used in a variety of other materials surface processing applications, among which are sputtering, Ion Beam Assisted Deposition (IBAD), surface hardening, and for surface charging control.

Thus, the present invention is particularly directed to an improved gaseous ion source assembly which is able to produce a ribbon-shaped high-current ion beam having a prechosen fixed breadth dimension which is at least thirty times greater, and often up to 200 or more times greater, than its thickness dimension—the beam's fixed breadth and thickness dimensions being measured normal to the Z-axis pathway and travel direction of the ion beam.

BACKGROUND OF THE INVENTION

The present invention provides ion beam sources which can address specific industrial needs. For the applications identified above, it is necessary to produce ion beams of many different charged species—a range and variety which commonly includes phosphorus, boron, carbon, nitrogen, oxygen, argon, silicon, germanium, and arsenic ions.

Such conventional applications require a high current, a range of energies from tens of eV up to one hundred keV, stability, precise control of the ions, and a long service life. High current for ion implantation demands many milliamperes of ions of the desired species, commonly more than 30 mA; and since the present invention is addressed to producing much larger ion beams of up to 1 A or more for reasons of productivity, the practitioner in the field becomes interested only in scalable ion source architectures which can produce current densities exceeding about 10 ma per sq. cm. at the exit aperture of the ion source, and which are preferably more than 30 mA/sq cm.

Also, singly-charged atomic ions are desirable in almost all conventional application instances, but sometimes molecular ions are usable. For more details and information, see two standard text books in particular: *The Physics and Technology of Ion Sources*, 2nd ed., Edited by Ian G. Brown, Wiley, 2004; and *Large Ion Beams*, A. Theodore Forrester, Wiley, 1988. Also, see U.S. Pat. Nos. 7,498,572; 8,723,135; 6,160,262; and 8,455,837 for a range of operational details.

£ By commonly accepted definition, a 'plasma' is deemed to be the fourth state of existence for physical matter: if one increasingly heats any matter appearing as a gas [or a solid, or a liquid]—that substance will eventually accumulate and contain enough energy to enter into a plasma state, in which some electrons are freed from atoms, and a quasi-neutral mix of atoms, positive ions, electrons and sometimes negative ions will coexist. Plasma is the state of matter from which ions are most easily extracted in vacuum.

The temperature of plasma electrons is generally in excess of 10,000 degrees K; and is most conveniently measured in units of electron Volts (eV), where one eV corresponds to 11,627 K.

Although in a few specific use instances the whole plasma may be in thermal equilibrium at a uniform temperature—in the overwhelming majority of real-world plasmas in ion sources, the electrons establish a thermal equilibrium at one temperature (typically one or two eV). But the ions are not in equilibrium with the electrons, because their mass is many thousand times that of the electrons, and they may remain at a temperature closer to the gas from which they were formed. The fundamental laws of kinematics for such collisions reveals that many millions of collisions are required between electrons and atoms/ion before the ion energy begins to approach the mean energy of the electrons.

Thus, in its most generalized form, an ion source functions to produce a plasma of differently charged ion species from a preselected material or substance; and then extracts and accelerates these ion species to high velocities as a shaped "beam" in which the multiple' ions are mono-energetic with velocities on the order of km/s.

£ Accordingly, the typical gaseous substance ion source will present at least two operational parts: (i) A plasma generating system; and (ii) a beam extracting system. Each of these component systems employs tangible structures and entities to achieve its intended purpose and function.

• The plasma generator is the source's operative subunit which creates a plasma from the gaseous substance; and from which a sufficient quantity of the desired or appropriate ion species is subsequently extracted as a shaped beam by the source's extraction system. There are multiple ways of generating a plasma from the gaseous substance; but the focus today is on electron impact ionization—where ions are created by electron impact, and where the electron energy is as low as practicable, usually 40 to 120 V.

This manner of generating a plasma typically requires the presence of a source of electrons with much higher energy than the average plasma electron. Thus, the plasma source will typically contain the following: A neutral gas or vapor at ambient temperature (which may be a temperature of several hundred K in some instances); a source of electrons with energies of 40 to 120 eV, a voltage which is more than sufficient to ionize the gas (see FIG.-2); electrons liberated from gas atoms by electron or ion impact, which rapidly come to thermal equilibrium at a temperature of a few eV; and ions created by electron impact, and which will have initial temperatures close to ambient, but which on leaving the plasma may have a mean energy value which is a sizeable fraction of the electron temperature. It is also desirable that the density of the ions be high and that their temperature be as low as possible.

• In noted contrast then, the ion source's extraction system is the operative subunit which accelerates the ions from the plasma, and produces a flowing ion beam of the desired shape and correct divergence angle for transport to its destination. Neutral particles and electrons are respectively ignored and repelled by the extraction system. Extraction systems for high current positive beams utilize a minimum of three electrodes, as shown in Prior Art FIG. 1.

£ It is therefore deemed useful here to present an accurate summary description not only of how ribbon shaped ion beams are created and what were the major advances occurring over time within the field itself; but also to identify correctly what constitutes the prevailing views and dominant vantage points of persons working today in this technical area.

Forced Electron Beam Induced Arc Discharge (FEBIAD) Ion Sources

Many conventional ion sources use plasmas for the generation and subsequent extraction of a ribbon shaped ion beam from an arc discharge chamber. Such ion sources typically include a plasma confinement chamber having an inlet aperture for introducing a gas to be ionized into a plasma; and an exit opening or ejection aperture through which the ribbon shaped ion beam is extracted from the plasma.

It is therefore valuable here to describe briefly what is the conventional operational theory of a forced electron beam induced arc discharge (FEBIAD) ion source. For this purpose, a schematic of a typical FEBIAD ion source is illustrated by Prior Art FIG. 1.—wherein the particular example of FIG. 1 is a Bernas type ion source, in which the magnetic field and the anticathode are specific to that type.

The FEBIAD Ion Source Structure

It will be recalled also that the function of the ion source is to produce a flowing stream of charged ions, as well as to extract and accelerate these streaming ions to high velocities. As part of this purpose and goal, the ejected stream of charged ions is directed to form a ribbon-shaped beam in which the ions are mono-energetic, with velocities on the order of km/s.

As schematically shown by Prior Art FIG. 1, the structure of the ion beam source typically includes: A solid arc chamber within which the arc discharge is to be contained; at least one anode; at least one cathode electron emitter; one or more extractor grids or electrodes; and sometimes a neutralizer. Each of these prior art structural entities is briefly described below.

Basically, the arc discharge ion source operates by initially introducing a pre-chosen gas into the internal cavity volume of the solid wall arc discharge chamber. A cathode electron emitter (such as a filament) provides mobile electrons which ionize the gas into a plasma state.

A voltage, typically 40 to 120V for applications of relevance, is applied between the cathode electron emitter and some other part of the cavity volume (referred to as the anode), thus electrons emitted from the cathode are accelerated to energies in the range of 40 to 120 eV, and this energy is sufficient that when electrons strike a gas atom or molecule, they can ionize it.

The ions and electrons together comprise the plasma. Because the electrons have higher velocity, they will tend to reach the walls faster, which causes the plasma (which is highly conductive) to develop a positive potential. Once this potential is sufficient to prevent further loss of electrons, the plasma can become stable. The plasma is normally slightly positive with respect to the anode; and standard text books describe this condition in greater detail.

One or more extraction electrodes containing a hole, or a slot, or an array of holes or slots is positioned at the front of the chamber; is aligned with a matching set of apertures in the chamber, external to the cavity volume; and allows the positively charged ions within the plasma to flow and become accelerated to high velocities. A potential difference is applied between the extractor electrodes and the arc chamber.

A neutralizer Is sometimes positioned downstream from the extractor grid, whereby enough additional electrons are then added to the flowing ion stream to balance the charge density of positively charged ions present within the ribbon-shaped beam. A complex relationship exists between the electrode potentials and the edge of the plasma in the vicinity of any such hole or slot; and if the right conditions are met, a highly parallel ion beam can be formed.

Ionization of Gas within the FEBIAD Source

One illustrative example of a gas which can be ionized into a plasma state within a FEBIAD source is phosphine. When phosphine is exposed to an electron stream within an arc discharge chamber, the neutral phosphine gas molecules will disassociate and yield positively charged phosphorous ($P^+$) ions, as well as positively charged hydrogen ($H^+$) ions—i.e., a plasma containing both phosphorous ions and hydrogen ions concurrently. The resulting plasma will thus comprise not only those ions desired for implantation into a workpiece, the positively charged phosphorous ($P^+$) ions; but also several undesirable ion species, the positively charged hydrogen ($H^+$) ions, molecular ions $PH_x^+$, and possibly $P_2^+$ as unavoidable by-products of the ionization process.

The phosphorous ions and the hydrogen and other ions co-exist within the plasma; and all the positive ion species are ejected together within the shaped beam extracted through the front opening or exit apertures of the source structure by the extraction grid or electrode. This production of multiple positively charged ion species holds true for all other kinds of plasmas provided by any appropriate source gas—each of which will generate a desirable ion species such as arsenic ions ($As^+$) and boron ions ($B^+$) and an undesirable ion species (such as a positively charged hydrogen ion or a negatively charged halide ion). Consequently, it is well recognized that any plasma can generate either multiple species of positively charged ions or both negatively and positively charged particles—along with some proportional quantity of un-ionized neutral atom species. Negative ions are not extracted because the source is biased positive with respect to the extraction electrode.

The Suitability of Different Ion Source Types

In order to obtain an extracted ion beam having optimal current (ampere) value and particular beam qualities, it is necessary to optimize the density of the ion species constituting the extracted beam yield, as well as to provide a meaningful range of other desired beam characteristics. For achieving such properties in ribbon shaped ion beams, the following practices and techniques have been conventionally employed.

1. The Technique of Electron Impact Ionization

Electron impact ionization of the neutral atom or molecular species is the most general technique for increasing the plasma density. Energetic electrons passing close enough to interact with an electron orbiting an atom species can give energy to that electron. The energy required to completely detach an initially ground-state electron is known as the ionization energy (or potential when expressed in V).

Prior Art FIG. 2 shows the evolution of ionization potential against charge state for the atom species. The ionization potential is only a threshold quantum; Ionization efficiency increases with incident electron energy up to about three times the ionization potential and then falls off at the higher energy values. A low primary electron energy will minimize the number of of high charge-state ions produced, and vice versa, thus by judicious adjustment of the voltage, the best formation conditions for a particular ion species may be optimized.

2. Generation of Positive Ions by Different Ion Sources

£ The practitioner working in the field must consider different types of ion sources that can, on some scale, produce ion beams usable in the applications of interest. It will be recalled that the requirement is: >1 mA per sq cm of specific ion species, at energies in the range from 50 eV to 100 keV. The practitioner can therefore eliminate further consideration of some categories of ion source, which are as follows:

(i) Negative ion sources of heavy ions—which are sputter sources using solid targets, and are not capable of the current densities or dimensions that the applications require.

(ii) Solid ionization sources—which can work very well for alkali metals, but not well at all for those ion species used today for doping semiconductors.

£ Instead, the practitioner can and will thus concentrate solely upon gaseous ion sources, and act further to narrow the available choices. Thus, the list worthy of further consideration offers only the following.

○ Cold cathode ion sources: These include some Penning sources, require high arc voltages and only generate very low ion currents. Furthermore, the high discharge voltage means that the range of ion energies is high; and this causes the beam to have high emittance, so that it cannot be transported ad refocused so easily.

○ Duoplasmatrons and similar sources: These require a small tight canal in which a magnetic field constricts a stream of electrons. These sources can meet the current density requirement; but cannot be used for ribbon beams, and do not scale up well.

○ Microwave sources (including ECR sources): These can produce high currents with high reliability of certain gas species; and they are well suited to producing low currents of high charge-state ions. But they produce high electron temperatures and relatively noisy plasmas, which results in relatively high beam emittance. These sources cannot be scaled up to meter lengths because this greatly exceeds the wavelength of the microwaves, which precludes uniform ionization.

RF ion sources of various types: These sources suffer similar shortcomings. Consequently, they are better used for lower currents; and they cause high ion and electron energies, and so produce high beam emittance. Plasma physics gives clear reasons why this should be so—i.e., these sources favor the production of less dense, higher temperature plasmas.

£ Consequently by process of elimination, the practitioner becomes limited to using ion sources based on the ionization of a gas or vapor by electron impact, where the electrons have energies in the range of about 40 to 120 eV. To meet the current density requirement, the practitioner needs a high current of several amps of electrons; and this demand in turn means that a hot cathode to produce electrons by thermionic emission is required. Accordingly, the cathode must be immersed in a plasma to reach the high current level at the specified voltage; and this results in a hot cathode arc discharge ion source.

The state of the prior art in this field today includes variants of the Bernas source, including those assemblies installed with an Indirectly Heated Cathode (IHC); and in limited sectors, variants of multicusp confinement sources. The Anode Layer Plasma Acceleration source is also available, which has some useful features for large ribbon beams, but fails in the need for production of monoenergetic ion beams.

The Bernas Source and its Type Variants

A Bernas source can produce high current ribbon beams of the desired species—with a beam breadth exiting the ion source of usually ~400 mm or less in commercial production, but sometimes up to 200 mm. In this Bernas source, the arc chamber is a hollow cavity approx 35 mm in cross section, and 100 to 250 mm long, with an exit slot in the long direction on its front face (see Prior Art FIG. 1). Within this arc chamber, the thermionic cathode is located at one end, with an anticathode at about the same potential at the other end. A uniform magnetic field of around 200 Gauss runs from end to end of the Bernas ion source. The arc voltage, typically 60 to 120V, is applied between the cathode electron emitter and the anode.

£ Electrons emitted by the cathode in the Bernas source are confined to a cylindrical volume about 10 mm in diameter by the magnetic field; and are turned around by the cathode potential at the ends; and thus are trapped. Gas or vapor is bled into the arc chamber, where the primary electrons ionize it very efficiently; and form a dense and stable plasma which has been measured to have electron temperatures around 1 eV.

It will be understood that the several amperes of fast electrons in the central trapped column contribute very little to the overall space-charge, the density of slow thermalized electrons being far greater. However, only the fast 'primary' electrons have sufficient energy to generate new ions. The electron energy is adjustable to maximize production of a given ion species from the feed gas, in cases where multiple species are formed. For completeness and a better general understanding of the plasma conditions in this Bernas ion source, the practitioner should consult *The Physics and Technology of Ion Sources,* 2nd ed., Edited by Ian G. Brown, Wiley, 2004; R. Bernas and A. O. Nier, Rev Sci Instr 19:895 (1947); and I. Chavet and R. Bernas, Nucl. Instr. and Meth. 51:77 (1967).

£ Several other points of information concerning the Bernas ion source are noteworthy: The plasma extends to within a few Debye lengths of the walls, and the Debye length can be calculated under typical conditions to be much less than 1 mm. The potential variation within the plasma is about ½ kT/e, where T is the electron temperature and k is Boltzmann's constant; and this quantity has been measured (see the cited Brown reference) at 1 eV. Thus, the potential within the plasma is very uniform, and the plasma is also known from measurement to be very uniform in density.

In addition, the ions are far cooler than the electrons; and are weakly accelerated outward radially from their point of formation toward the walls. The acceleration potential within the plasma is about 0.5V, (see the Ito reference), and the acceleration between the plasma and the wall is a few volts. The plasma extends to within 1 mm of the walls.

£ The electrons from the hot cathode are accelerated rapidly to an energy a few volts greater than the anode potential within the plasma; and are confined to tight spiral trajectories on the magnetic field lines, so they oscillate many times up and down the arc chamber. They will undergo inelastic collisions with gas atoms, with a mean free path in excess of 1 meter under typical conditions. In these collisions, if the electrons ionize the gas, they will lose at least the ionization potential in energy, and probably significantly more. Thus the electrons slow down. Once slowed to about 10 eV, the probability of elastic coulomb scattering collisions with other free electrons grows; and this probability is inversely proportional to the electron velocity, so these electrons interact increasingly strongly and rapidly come into thermal equilibrium. An excess of electrons tends to exist, so those electrons with larger energies and hence larger orbital radii will tend to collide with the walls at anode potential before others do; and this mechanism acts to reduce the temperature of the plasma.

Only a few percent of the ions created will randomly move in the correct direction to directly exit the slot. However, the remaining ions hit the walls and then get recycled; and most will eventually leave the slot on a subsequent attempt. If the desired ion species is non-volatile (e.g. $B^+$), the use of a halide gas will etch material from the walls, which would otherwise be wasted; thus $BF_3$ is a common feed gas for boron ions.

£ The Bernas ion source is acknowledged to be a very successful design; but it is not easily scaled up, because it requires a magnetic field to run the length of its arc chamber. A longer arc chamber length dimension requires more ampere turns to generate the field; but a secondary problem rapidly prevents progress—the magnetic field becomes weaker in the middle and stronger at the ends. Heroic measures are thus required to counter this effect when the dimension is above about 200 mm of active arc length; and such counter-measures as are presently used today can only produce a very limited benefit.

Consequently, the practitioner working in the technical field would conclude that the Bernas ion source cannot be scaled to lengths of 1 meter or greater; and that even if the Bernas source could be so scaled up, the costs of the related equipment would grow with the cube of the growth in linear dimensions.

Multipole Confinement Sources

¶ The density of a plasma is dictated by the balance between ion production and ion loss processes—with the added restriction that to maintain neutrality, the ion charge and electron charge densities must be equal. Energetic electrons, which are more useful for ionization, are more easily lost to the chamber walls than the slower ions unless steps are taken to return the fast electrons to the plasma. It would also be of advantage to allow slow electrons with less than the minimum ionization energy to escape thus reducing the possibility of electron-ion recombination.

A strong multipole magnetic field surrounding the plasma volume meets these requirements. The increased path length of the energetic electrons increases the probability of ionization. Cold (lower energy) electrons undergo a much higher rate of elastic Coulomb scattering from each other; and thus their rate of diffusion across magnetic field lines (that would otherwise confine them) is very high. Thus, cool electrons diffuse across the multipole magnetic field until they can reach the walls and be lost. Improvements in ion ionization efficiency result in a reduction of neutral pressure for the same plasma density which can make for a more open source and ease vacuum pumping requirements.

¶ It is therefore useful here briefly to discuss what a multipole field is and to identify some of its properties. In their simplest forms, many types of magnetic field have certain rotational symmetries about a single axis can be analyzed as cylindrical harmonics.

In the most basic terms, these may be accurately defined and described as follows:

• A dipole field is the kind of magnetic field produced by a pair of poles having opposite polarity. If the opposite polarity poles are quasi-infinite planes, the whole of the generated dipole magnetic field is uniform in both strength and direction.

• A quadrupole magnetic field is the kind of magnetic field produced collectively by four poles which are symmetrically disposed in series around an axis. The four poles disposed in series alternate in polarity; and, in their purest form, are assumed to have the shape of a right-hyperbolic surface asymptotic to a pair of planes through the origin (as is shown by Prior Art FIG. 3a).

In this quadrupole field format, if the practitioner plots the magnitude and direction of the generated quadrupole magnetic field around a circle centered on the origin, the magnitude is found to be constant—but the direction of the field rotates once in passing around the circle. Also, the magnitude of the quadrupole magnetic field is directly proportional to the radius of the circle.

• A sextupole magnetic field is constructed in a similar manner (to the dipole and quadrupole fields), but typically employs six discrete poles of alternating polarity in series; and the hyperbolae are asymptotic to planes inclined 60° to each other instead of 90. A typical sextupole magnetic field is shown by Prior Art FIG. 3b.

The magnitude of the sextupole magnetic field is also constant around a circle; but the field direction changes twice in passing round the circle. The magnitude of the sextupole field is proportional to the square of the distance from the center.

• Higher order multipole magnetic fields may be constructed as needed or desired by analogy. Thus, for example, an octupole magnetic field typically uses eight discrete poles of alternating polarity in series. In each of these similar instances, the total number of discrete poles employed to generate the higher order magnetic field typically is a mathematically even value.

¶ It will noted and appreciated, however, that the chosen number of multipoles used together to generate one type of magnetic field will interact collectively in a complex way. For this reason, a multipole magnetic field which is a linear superposition of several different fields can be generated by a simpler pole shape—where the pole shape does not conform to the basic multipole definitions, but does maintain some symmetry. The retained symmetry of the pole construction can permit certain types of multipole fields to be generated, while suppressing others, as shown in Prior Art FIG. 3c.

Since a high n-order multipole field is characterized by a field strength that increases radially with $r^{(n/2-1)}$, it follows that the field in the central spatial zone of a high-order multipole magnetic field is very close to zero value for a considerable fraction of the available total volume, the fraction increasing with the actual number of poles employed. It is considered desirable in many ion sources to keep the magnetic field very low, except near the edges where the intent is to turn the electrons back.

Multicusp Magnetic Field Arrangements

The number of discrete poles used to generate a magnetic field can be increased when desired or required; and such poles need not in general have cylindrical rotational symmetry. Alternating the field components in the axial direction as well as the azimuthal direction constitutes an approach characterized as a 'checkerboard' array of poles; and this arrangement is used in 'multicusp' plasma containment devices.

¥ Ion sources based on permanent magnet multipole confinement have been known and developed since about 1975 [see for example: K. N. Leung et. al., *Characteristics of a Multidipole Ion Source*, Rev. Sci. Inst., 49:321 (1978); and K. N. Leung, *Multicusp Ion Sources*, Proc. 5th. Int. Conf. Ion Sources, Beijing, 1983, Rev. Sci. Inst., 65:1165 (1984)]. The main advantages of these 'multicusp' sources is their low operating pressure; a stable plasma; and the capability that they can be made to almost any size, provided there are not too many gaps in the multipole field configuration.

This kind of field arrangement is named 'multicusp' because at multiple locations a magnetic cusp intersects the wall. This is a point at which the magnetic field is very high, usually the highest points in the system, and simultaneously the lines of flux intersect the walls at near normal incidence. At a cusp, an electron moving toward the wall along just the right line can reach the wall without deflection; but if the electron deviates from this path by a very small angle, it is turned back into the chamber by the 'magnetic mirror effect'—whereby kinetic energy initially directed toward the wall is redirected in an orthogonal direction as the spiral trajectory tightens around a field line. Then, this energy is redirected away from the wall as the trajectory 'unsprings'.

¥ There are cylindrically symmetric versions of a cusp-source known as a 'monocusp'—which are considered to be the simplest such arrangement [see Brainard and O'Hagan, discussed in the Brown reference cited above].

Multicusp confinement is vastly better than having no plasma confinement at all, but it is imperfect. It leaks fast electrons to the walls. The density of plasma in most multicusp sources is ~1% of that of a Bernas ion source.

The Anode Layer Plasma Acceleration Ion Source

φ One other type of ion source requires discussion, since it has certain characteristics which at first appear to match the requirements well: The Anode Layer Plasma Acceleration source ("ALPA") [see for example: V. V. Zhurin, H. R. Kaufman, and R. R. Robinson, *Plasma Sources Science and Technology* 8, R1 (1999)].

In this ALPA source, electrons are trapped by mutually orthogonal electric and magnetic fields in a channel called a 'racetrack', because it can take the form of an elongated oval with parallel sides. The racetrack comprises a circular, elliptical or other closed curve channel bounded on two sides by ferromagnetic cathode electrodes; and a non-magnetic anode placed behind this channel. Typically the channel is ~3 mm wide between the walls; and the 'racetrack' path around the channel is 0.2 to 3 meters long.

The anode in the ALPA source is often about 5 mm behind the channel; and the anode presents a normal surface facing through the channel into open space. The cathode channel walls extend for about 5 mm to 10 mm away from the anode, and then open into the vacuum.

φ In the ALPA source, a magnetic field is established by permanent or electromagnetic means between the two ferromagnetic cathode electrodes; and a portion of this field extends toward the anode, some field lines being tangent to the anode and others almost parallel to its surface. If the anode is biased 500V or so positive with respect to the cathode, the electric field so formed is largely orthogonal to the magnetic field.

φ This arrangement is conducive to forming a stable plasma in which the following events occur:

(a) Electrons emitted from the cathode surface for any reason are initially accelerated toward the anode, but are forced to spiral the magnetic field lines; and have a long complex path of cycloidal form. These cycloids have a drift velocity around the racetrack channel whose magnitude is given by E/B, where E is the electric field, and B is the magnetic field. The trajectories if unscattered would have an extremely long path length.

(b) Gas introduced into the channel is ionized by collisions with any electrons orbiting in the channel, and the positive ion so formed is weakly accelerated toward the open face of the channel. Concurrently, the electron so formed is accelerated further toward the anode; and adds to the population of ionizing electrons. A small proportion of the positive ions formed may strike the cathode; the majority can escape into open space in front of the source with an energy that depends on the potential of the location at which they were ionized. Those that strike the cathode will liberate several more free electrons.

(c) By these means a stable plasma is established. Because of the transverse magnetic field and the applied voltage, an electric field exists within the plasma—accelerating ions out of the channel away from the anode and attempting to accelerating electrons toward the anode. Because the electron movement is diverted by the magnetic field, a substantial electric field can exist; the plasma conducts very poorly in this direction normal to the magnetic field.

(d) An annular ribbon-shaped ion beam is accelerated out of the slot. By adding annular extraction electrodes (with the arrangement of potentials shown in Prior Art FIG. 1), the annular beam may be accelerated to higher energies.

φ Thus in the ALPA source, the path of a trapped electron can in principle be an infinitely long cycloid wrapped around within this channel. These electrons ionize gas supplied into the channel, creating a very high current (amperes) of positive ions, which are pushed by the electric field out of the channel. This ALPA source can easily be elongated to a length of one or two meters; and with the addition of triode extraction electrodes and neglecting the rounded ends can be viewed as a source of two parallel ribbon ion beams, each meeting our requirements.

However measurements have shown that the potential gradients within this source's plasma span over 100V, giving the ions a very large energy spread and making any goal of mass-analyzing the high current beam prohibitively difficult. Nevertheless, certain features of the plasma of this source have been used as a guide in the design of the present invention.

Chronology of Major Advances in the Technical Field

Reliable ion sources for generating ribbon-shaped beams of high current were first developed in Calutron isotope separators as part of the Manhattan Project (1940-1945). These sources were immersed in a strong magnetic field which extended in the direction of the major transverse dimension of the traveling ribbon-shaped beam, wherein the generated magnetic field was also used to analyze and separate the ion species in the beam individually.

The Freeman and Bernas Ion Sources

§ The subsequent development of the Freeman and Bernas ion sources, which use smaller and independently generated magnetic fields, allowed for more efficient ion sources to be used alone and independently of the downstream positioned analyzing magnets.

§ The Freeman type Ion source is disclosed in full in Nucl. Instr. and Meth. 22:306 (1963), which reveals the Freeman structural arrangement as the use of a high-current power supply to provide a heating current through the cathode filament, which runs down the middle of the arc chamber parallel to an applied magnetic field. A separate arc power supply applies a voltage at a maximum of about 120 volts between the cathode filament and the arc chamber—with the arc chamber walls serving as an anode. The hot cathode filament then emits electrons which are trapped by the magnetic field, accelerated through the gas within the arc chamber cavity volume in order to create a plasma of positively charged ion species within the confines of the arc chamber.

§ The Bernas ion source is disclosed in detail in Nucl. Instr. and Meth. 51, 77 (1967), and is shown in Prior Art FIG. 1. When modified as described in U.S. Pat. Nos. 5,262,652 and 5,497,006 the Bernas ion source can have either a directly heated or an indirectly heated cathode, with a discrete power supply sufficient to provide a heating current through the cathode filament; but will always contain a separate arc power supply in order to provide a desired arc potential between the cathode filament and the anode or arc chamber walls.

The Indirectly Heated Cathode (IHC) Ion Sources

Δ Primarily, indirectly heated cathode (IHC) ion sources have been developed and refined in order to improve ion source lifetimes in ion implanters. Detailed descriptions of the kinds of structures and operational features of such improved IHC ion sources are provided by U.S. Pat. Nos. 7,138,768; 6,777,686; 6,348,764; 6,259,210; 5,763,890; 5,703,372; 5,497,006; 4,714,834; 3,924,134; and 3,238,414 respectively, the individual texts of which are expressly incorporated by reference herein.

Δ An indirectly heated cathode comprises a relatively massive cathode structure which is heated by electron bombardment from a nearby directly heated thermionic filament; and then emits electrons thermionically. The filament used for electron bombardment is physically isolated from the generated plasma within the arc chamber cavity volume, and thus has a relatively long lifetime of use. Although the indirectly heated cathode is exposed to the corrosive environment of the arc chamber, its massive structure ensures useful operation over an extended time period.

Several attributes are particularly noteworthy to the practitioner: The filament within the indirectly heated cathode (IHC) ion source must be electrically isolated from its surroundings; and it must be electrically connected to a 600V variable negative bias power supply. The indirectly heated cathode which surrounds this filament is heated by the accelerated electrons leaving the filament as well as by radiant heat. It must be thermally isolated from its environmental surroundings to inhibit cooling (which would cause the cathode to stop emitting electrons).

Accordingly, indirectly heated cathode designs utilize a cathode format which often appears as a disk, and is supported at its outer periphery by a thin wall tube of approximately the same diameter as the cathode thickness. The supporting tube has a thin wall in order to reduce its cross sectional area, and thereby reduces the conduction of heat away from the hot cathode. The thin wall tube typically has cutouts along its length to act as insulating breaks and which further reduce conduction of heat away from the hot cathode.

The thin wall tube used to support the cathode should not emit any electrons; but it has a large surface area, much of it held at high temperature. This large surface area of the tube will lose heat by radiation, which is also the predominant way that the hot cathode loses heat. The large diameter and surface area of the tube thus increases the size and complexity of the structure used to clamp and connect to the cathode. One conventionally known cathode support includes three parts and requires threads to assemble.

Δ The development of the Indirectly Heated Cathode (IHC) ion source has increased useful cathode life over that of tungsten filaments, simply because the cathode can be made massive in order to increase the time before erosion causes operational failure. For long life use, cathode electrode design will maximize thickness, while concurrently minimizing exposed electrode surface area in order to avoid the need for excessive power.

In addition, many different ion species are produced using halide gases and vapors by the Indirectly Heated Cathode (IHC) ion source; and the transportation of charged ion material between the cathode/anode electrodes by halogen reactions at elevated temperatures in the plasma is an unavoidable event as well as a necessary evil accompanying efficient production of certain ion species. Such events and material transport is often the true determinant of operative service life.

Δ All these conventionally known and used high current ion sources to date (as well as certain other minor variants of them, with the exception of the ALPA source) apply a magnetic field along the linear length dimension of a structurally defined arc discharge chamber, wherein the applied magnetic field will confine traveling electrons to spiral paths around a central axis of the arc chamber. The electrons are introduced to the magnetic field on this central axis, usually at one discrete end of the arc chamber structure (but notably there are exceptions) from a heated thermionic cathode electrode surface biased at a negative voltage typically between about −40V and −120V with respect to the sidewalls of the arc chamber, which then constitute and physically form the anode electrode positive surfaces of the system.

Conventional Uses and Applications for Ribbon-Shaped Ion Beam Sources

Ion implantation systems or ion implanters are widely used to dope semiconductors with impurities in integrated circuit manufacturing, as well as in the manufacture of flat panel displays. In such systems, an ion source ionizes a desired dopant element, which is extracted from the source in the form of an ion beam of desired energy. The ion beam is then purified by passing it through a large deflecting magnet which focuses only the desired ions through a resolving slit, and is then directed at the surface of the workpiece, such as a semiconductor wafer, in order to implant the workpiece with the dopant element.

The ions of the beam penetrate the surface of the workpiece to form a region which, after thermal annealing to repair crystal damage, has a desired conductivity, such as in the fabrication of transistor devices in the wafer. Many additional new and related uses of ion implantation have been developed. The implantation process is typically performed in a high vacuum process chamber which prevents dispersion of the ion beam by collisions with residual gas molecules and which minimizes the risk of contamination of the workpiece by airborne particles.

A typical ion implanter includes an ion source for generating the ion beam; a beam pathway which often includes a mass analysis magnet for mass resolving the ion beam; and a vacuum chamber containing the target semiconductor wafer (or other substrate) to be implanted with ions by the traveling beam. Some representative prior art examples of such assemblies and systems are those described by U.S. Pat. Nos. 4,862,032; 5,497,006; 5,558,718; 6,664,547; 6,686,595; 6,744,214; 6,815,666; 6,958,481; 7,838,850; 7,863,582; 8,071,958; 8,330,118; and 8,368,309 respectively—whose descriptive texts are each expressly incorporated by reference herein.

A common alternative prior art arrangement is exemplified by flat panel display implanters, see for example U.S. Pat. Nos. 6,160,262, 8,455,837. In addition, for high energy implantation systems, an acceleration apparatus may be provided between the mass analysis magnet and the target chamber for accelerating the ions to high energies.

A further use for an Ion source without any acceleration system is as a source of cool plasma to suppress the development of high voltages, charging damage, and related issues when a high current ion beam is transported and impinges on an insulating or partially insulating target. This occurs in commercial ion implanters Perspectives of the Ordinary Practitioner Working in the Technical Field Today £ Despite all of the foregoing developments in the relevant technical field, conventionally known ion sources are demonstrably unsuitable for making high current-density ribbon-shaped ion beams directly which are meaningfully larger in linear dimensional length than about 150 mm (although the beam's initial axial length can be subsequently indirectly expanded), owing to and as an immediate consequence of the size limitations of the axial magnetic field on which they depend.

£ As is well established and long-recognized in this technical field: the longer the linear length dimension of the arc chamber, the greater the number of ampere turns required to excite the long axial magnetic field. Moreover, such a long axial magnetic field has many other serious disadvantages: It is progressively more and more difficult to keep the magnetic field uniform as its length dimension grows, without also making the magnetic field extent larger in each of its other (width and depth) dimensions. This kind of three-dimensional enlarged magnetic field size would be most undesirable since it would cause increasing parasitic deflection of the whole extracted ion beam; and it becomes progressively ever more difficult to keep this increased deflection uniform along the length dimension of the traveling ion beam.

£ It will therefore be recognized and appreciated that, despite all the technical innovations and design enhancements existing conventionally to date, there remains considerable and immediate need for an improved ion source. In particular, the fields of 450 mm silicon wafer implantation, flat-panel display implantation, and solar cell implantation—as well as other materials modification applications—would benefit greatly from an ion source which can be extended in length to make high-current uniform ribbon-shaped ion beams of breadth 450 mm or more, and which can be further extended in length to be as great as 1 m, 2 m, or more. This quality and kind of innovation requires a radical change in concept, coupled with a major move away from the conventional use of a magnetic field parallel with the long direction of the extraction slot.

£ At the same time, it would be desirable to retain the benefits of indirectly heated cathodes, as well as certain other characteristics and features of the traditional White and IHC ion sources. These would include the ability to tolerate high temperatures; to run at high efficiencies in order to generate high currents of $B^+$ ions from $BF_3$ gas, to run at high current densities of >20 mA/sq. cm, and to obtain other species from halide gases and gaseous vapors. Furthermore hot cathode ion sources tend to produce lower plasma temperatures than RF-excited ion sources; and this event is beneficial for producing ion beams of low emittance—i.e., a minimum of transverse momentum for a given aperture size. It is further desirable that the ions of the beam be generated in as low a magnetic field as possible; and that the magnetic field should have no significant component in the breadth dimension of the ion beam.

£ Consequently, if one were able to develop an improved ion source assembly for producing a traveling ribbon ion beam with a breadth dimension which is at least fifty times its thickness dimension, this achievement would be seen as a surprising and unforeseen improvement over the assemblies in the prior art. Then, if the extracted ribbon shaped ion beam had a breadth dimension several hundred times greater than its thickness dimension—the breadth and thickness dimensions being measured normal to the direction of ion beam travel—this remarkable increase in ribbon beam breadth would be recognized as a major refinement and unpredictable advance in the technical field.

SUMMARY OF THE INVENTION

The present invention may be summarily defined in several different manners, owing to its Intended scope and structural variability range. For simplicity purposes, therefore, solely a Jepson-type format is presented here.

In an ion beam source able to produce a ribbon-shaped ion beam having a measurable breadth dimension which is at least ten times greater than its thickness dimension, the breadth and thickness dimensions of the produced beam being normal to the Z-axis direction of travel for the beam, and wherein the ion beam source includes (i) a closed arc discharge chamber including a discrete solid front wall which presents at least one exit aperture for ion beam egress, a discrete solid back wall, at least two laterally positioned and oppositely situated solid adjoining sidewalls, two discrete solid and oppositely placed contiguous endwalls, and an internal cavity of determinable volume and configuration, wherein the arc discharge chamber presents a predetermined width dimension which extends along the Y-axis, a set front-to-back dimension which extends along the Z-axis, and an arbitrarily chosen fixed length dimension which extends along the X-axis and can vary in its measurable size from about 80 mm to about 3,000 mm, (ii) at least one thermionic cathode disposed within said internal cavity volume of said arc discharge chamber, each cathode terminal being able to emit a stream of moving primary electrons on-demand, (iii) a controlled orifice for introducing a gaseous substance into the internal cavity volume of the arc discharge chamber, (iv) at least one extraction electrode located externally to the exit aperture in the front wall of the arc discharge chamber, and (v) a remotely positioned source of electrical power having both a positive terminal and a negative terminal;

the substantive structural improvement of:

an operative primary electron trap assembly able to generate and install at least one discernible quadrupole magnetic field on-demand within the internal cavity volume of the arc discharge chamber, wherein said installed quadrupole magnetic field primary electron trap assembly causes (α) a redirection of travel pathways for the moving primary electrons emitted by the cathode terminal in a direction away from the internal peripheral regions and marginal edges of the cavity volume near the two adjoining sidewalls and the back wall of the arc discharge chamber, (β) a redirecting of travel movements for the primary electrons towards the central spatial zone then existing in the approximate middle of the confined cavity volume of the arc discharge chamber, and (δ) a distribution of the redirected primary electrons uniformly at the approximate middle of the confined cavity space over the length dimension distance of the arc discharge chamber, and wherein said primary electron trap assembly uses combined electric and magnetic fields of which no significant component is directed in the X-axis direction, and wherein said primary electron trap assembly comprises (a) at least one identifiable rod-shaped anode disposed upon the inner face surface of one laterally positioned adjoining sidewall of the arc chamber and extending over the length dimension of the adjoining sidewall in the X-axis direction within the cavity volume of the arc discharge chamber, said rod-shaped anode being immersed within and encompassed by said installed quadrupole magnetic field of high strength within the cavity volume such that the lines of magnetic flux curve over and around each disposed rod-shaped anode, said curved magnetic flux lines being effective to block primary electrons moving within the cavity volume from reaching each disposed rod-shaped anode, (b) a magnetic field generating yoke subassembly lying at a preset distance adjacent to and surrounding the exterior faces and perimeter of at least three discrete three walls of the arc discharge chamber, said magnetic field generating yoke subassembly comprising a open yoke framework upon which at least three discrete magnetic pole constructs of alternating polarity lie disposed azimuthally about the X-axis and extend over the length dimension of the arc discharge chamber, said polarity-alternating multiple pole constructs collectively generating and installing a discernible quadrupole magnetic field within the dimensional confines of the internal cavity volume of the arc discharge chamber, wherein the field strength of said installed quadrupole magnetic field is weaker, but not a zero value, along the internal face surface of the front wall than at the internal face surfaces of the two oppositely situated adjoining sidewalls and back wall of the arc chamber, and wherein the strength of said quadrupole magnetic field falls to an effective zero value along a line at a spatial location which exists forward of the cavity midline along a central plane aligned with the X-axis and lies medially over the exit aperture in the front wall of the arc chamber, (c) a thermionic cathode which is spatially located close to the internal face surface of an end wall of the arc discharge chamber such that the primary electrons emitted by the cathode encompass the null value axis of effectively zero magnetic field strength then existing approximately at the cavity volume midline along a central plane aligned with the X-axis and extending medially adjacent to the exit aperture in the front wall of the arc chamber, and (d) an electrical connection between said spatially located thermionic cathode and the arc chamber which causes the potential of said located cathode to have a small positive value with respect to the potential of the arc discharge chamber.

As defined above, the primary electron trap assembly of the significantly improved ion source is demonstrably operative and surprisingly effective such that all of the following events occur in-situ:

(α) The moving primary electrons emitted from the cathode are accelerated toward the anode rod(s) and/or toward the positive potential of the plasma formed by electron-impact ionization within the arc chamber;

(β) The moving primary electrons emitted from the cathode have insufficient kinetic energy to reach any component part or wall of the arc chamber except the disposed rod-shaped anode(s);

(γ) The moving primary electrons emitted from the cathode are substantially deflected by the protective quadrupole magnetic field away from the disposed anode rod(s) with a gyro-radius many times smaller than the distance of the anode rod(s) from the zero-value magnetic strength field line, and are redirected into cycloidal and oscillatory paths which cannot reach or intersect with the disposed anode rod(s);

(δ) The primary electrons emitted from the cathode are imparted with a positive or negative X-axis directed motion with a speed [measured as E/B] in the regions of crossed electric and magnetic fields;

(ε) The moving primary electrons emitted from the cathode are prevented from reaching any part of the internal sidewalls or endwalls of the arc chamber because the electrostatic potential of the abutting endwalls is set at a negative value with respect to the potential of the cathode; and (φ) The moving primary electrons emitted from the cathode become trapped in a central cross-shaped zone of the internal cavity space and are uniformly distributed centrally along the X-axis over the length dimension of the cavity volume by the combination of electrostatic and magnetic confinements.

BRIEF DESCRIPTION OF THE DRAWINGS

The present invention may be better appreciated and more easily understood when taken in conjunction with the accompanying Drawing, in which:

Prior Art

Prior Art

Prior Art

Prior Art

Prior Art

FIG. 7b shows a perspective view, partially disassembled, of the 2$^{nd}$ preferred embodiment of FIG. 7a;

FIG. 8a is a perspective view of the 2$^{nd}$ preferred embodiment which shows the proper positioning of the extraction electrodes;

FIG. 8b is a cross section view of the 2$^{nd}$ preferred embodiment showing the detailed mounting of the extraction electrodes of FIG. 8a.

DETAILED DESCRIPTION OF THE INVENTION

I. The Scope of the Invention

The Invention as a Whole

Figure 1:
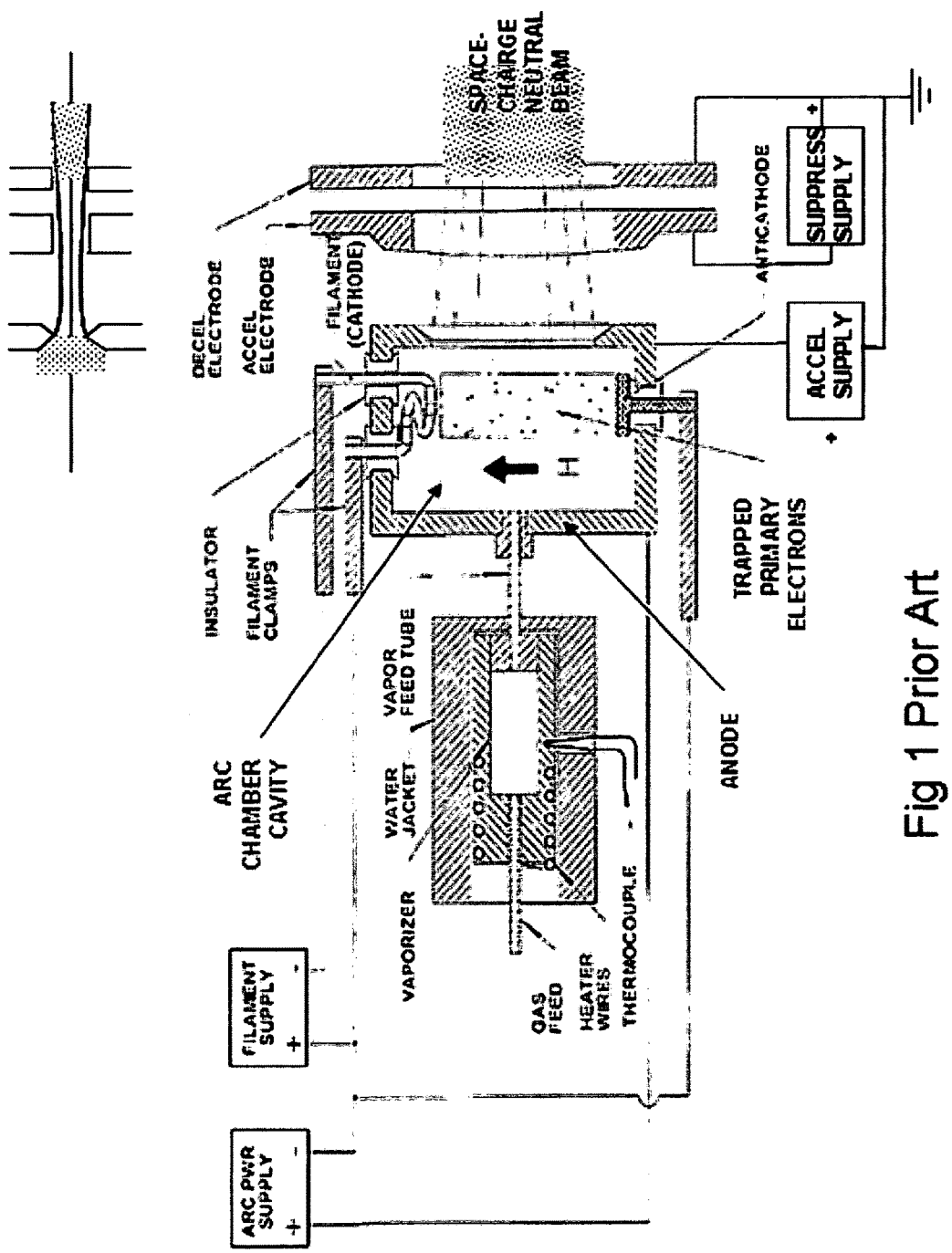
FIG. 1 is a schematic illustration of a conventionally known ion beam source for producing high current positive beams and which utilize a minimum of three electrodes.

¶ The present invention is a major substantive improvement in ion source assemblies; and is able to produce a ribbon-shaped ion beam having an arbitrarily chosen breadth dimension which is at least ten times greater [and often more than thirty times greater] than its thickness dimension, the breadth and thickness dimensions of the beam being normal (perpendicular) to the direction of travel for the ion beam.

¶ The improved ion source comprises not less than two discrete component parts:

(1) A closed, solid wall, prism-shaped arc discharge chamber having limited width and depth dimensions, and which concurrently has an arbitrarily chosen and predetermined length dimension which can be as small as 80 millimeters and alternatively exceed 3,000 millimeters in size; and (2) A primary electron trap assembly which comprises at least an adjacently located magnetic field generating yoke subassembly able to provide a discernible quadrupole magnetic field internally within a confined cavity volume existing within the measurable dimensions of the arc discharge chamber walls.

¶ The improved ion source optionally includes the additional structural features of:

(3) an intervening cooled partition barrier which serves to orient, align, and separate the magnetic field generating yoke subassembly at a fixed distance from and in a surrounding adjacent position around the arc discharge chamber, and cools the magnetic components to protect them from heat and high temperatures; and (4) a triode or tetrode beam extraction electrode system wherein each electrode comprises two separate pieces, one on each side of the beam, connected electrically to appropriate power supplies, and mounted using insulators to the magnetic yoke subassembly or to the cooled partition barrier, in order to maintain precise control of the spacing in the Y-axis and Z-axis directions of the different electrodes from each other, along the full breadth of the beam, notwithstanding the effects of thermal expansion caused by heat radiation and accidental beam strike on the electrodes.

¶ The closed arc discharge chamber is an elongated, prismatic shaped, solid wall housing traditionally made of refractory material(s); has a confined cavity volume of fixed configuration and determinable dimensions; includes at least one discrete rod-shaped anode electrode and at least one discrete cathode electrode individually placed upon the walls within the chamber's confined cavity space; provides one or more controlled conveyance ports through which a gaseous substance can be introduced to the confined cavity space of the chamber; and presents at least one open exit aperture at the front of the arc chamber, through which ions can be extracted to form a traveling ribbon-shaped beam.

¶ Within the internal cavity space of the prismatic shaped arc discharge chamber are:

(a) At least one thermionic cathode (typically a 10 mm dia loop of tungsten wire or slab of tungsten, and heated to over 2000° C.) disposed upon or close to one end wall surface and set at or slightly positive with respect to the electrical potential of the arc discharge chamber; and (b) At least one rod-shaped anode, and more desirably two elongated anode rods, individually disposed close to an interior face surface of a laterally positioned adjoining sidewall, and which extends over the entire arbitrarily chosen length dimension of the arc chamber. The rod-shaped anode(s) is/are connected to the positive terminal of a recognized source of electrical power at between 40V and 120V; and the cathode(s) is connected to the negative terminal of the same source of electrical power, and the arc chamber may be connected by resistive connection to be between about 0 and 5 V positive with respect to the cathode.

¶ Because the prism-shaped arc discharge chamber must reside in a vacuum environment, while the adjacently located magnetic field generating yoke subassembly of the primary electron trap assembly is frequently located in an ambient air environment, the two components must be operatively oriented, correctly aligned and properly held in separated adjacent positions.

For achieving this purpose, a non-magnetic partition barrier is tangibly placed as a intervening divider between the two components. This partition barrier is employed as an intervening rampart and dividing bulwark by which to orient and align properly the arc discharge chamber at a fixed spatial distance adjacently to the magnetic field generating yoke subassembly—while concomitantly maintaining the physical separation of the vacuum environment from the ambient air environment.

In such environment-separation instances, it is most desirable that the intervening partition barrier also provide internal coolant passages to maintain it at or near room temperature in spite of the substantial radiated heat from the arc discharge chamber; and it is preferable that the partition barrier be correspondingly shaped so as. to surround the exterior faces of the arc chamber structure over its back wall and at least two of its oppositely situated adjoining sidewalls.

¶ The discrete magnetic field generating yoke subassembly of the primary electron trap assembly is thus a discrete operational article and tangible structure that can appear in a variety of different construction formats:

A first operative format is a multipole array comprising at least three discrete ferromagnetic pole constructs of alternating polarity, which are individually disposed in series upon an open U-shaped yoke framework. All three ferromagnetic poles in the multipole array are physically separated and lie apart from each other each on one internal face of the yoke frame.

This multipole array and yoke framework constitutes the yoke subassembly which is then positioned at a set distance apart from, and becomes adjacently located around and over the exterior faces of the adjoining sidewalls and back wall of the arc discharge chamber; and then will Ile with Its direction of magnetization orthogonal (or perpendicularly, or normal) to the length dimension of the arc discharge chamber. Of the three ferromagnetic poles in this format of the magnetic field generating yoke subassembly, one of these poles is merely an elongated shaft or bar formed of ferromagnetic matter, while two of these magnetic pole constructs are elongated shafts or bars formed of ferromagnetic matter around which are placed elongated wire winding coils.

In marked difference, a second format of the magnetic field generating yoke subassembly is an arrangement of a U-shaped ferromagnetic yoke framework, upon each of two opposing sides of which is mounted an elongated ferromagnetic pole, connected to the yoke with a linear array of permanent magnets, so as to magnetize the two opposed ferromagnetic poles with the same polarity. A third ferromagnetic pole is attached to the internal face corresponding to the base of the U-shape, thereby presenting to the interior a pole of the opposing polarity to the side poles. Again the direction of magnetization presented by this yoke framework is everywhere substantially orthogonal (or perpendicularly, or normal) to the length dimension of the arc discharge chamber.

In this format, at least three discrete ferromagnetic poles are disposed in sequential series upon a U-shaped yoke framework, and at least two of the three incorporate permanent magnets. The entire open yoke subassembly is then placed at a known distance apart from but adjacent to the exterior faces and exterior perimeter of three co-joined walls in the arc discharge chamber, with the direction of each pole's magnetization being orthogonal (i.e., perpendicular or normal) to the arc chamber's X-axis and length dimension.

Alternatively again, a spaced multipole array of four or more ferromagnetic rods magnetized by connected commercially available permanent magnets disposed individually in sequential series may be used as a third desirable structural format of the magnetic field generating yoke subassembly.

This particular $3^{rd}$ format and arrangement has the extra advantage that the total number of individual permanent magnets may be increased as needed for the production of different strengths of generated quadrupole magnetic field. This $3^{rd}$ multiple permanent magnet construction model is transversely integrated upon a supporting yoke framework to form a subassembly; and this yoke subassembly will then be transversely positioned with respect to the chosen length dimension and X-axis of the arc discharge chamber.

Intended Uses and Expected Applications

ϕ The present invention is remarkably broad in scope and is intended to be employed in multiple, alternative, and markedly different circumstances of use. It is believe both necessary and essential that the true scale and purview of the instant invention be properly understood and appreciated.

☐ In a first expected use circumstance, the invention is employed as a retro-fittable upgrade to presently existing ion beam sources, as exemplified by those arc discharge chamber constructions currently used in ion implantation systems, IBAD (Ion Beam Assisted Deposition) systems, and material treatment systems of various kinds. The present invention can easily substitute for ion sources producing short ribbon beams (breadth from 10 to 100 mm), the principle advantage being the substitution of a small internal permanent magnet system for a large external magnet. Other advantages or disadvantages may become known concerning specific species, energies, or other issues.

☐ In a second alternative use circumstance, the size dimensions and structural alignments of the ion beam source assembly are markedly altered to offer ion beams with hitherto unattainable combinations of properties including beam breadth, current density and total current, ease of service, ion beam uniformity, ease of control, ease of operation. Using the coordinates defined herein and shown in the figures, the beam breadth in the X-axis direction can be increased from ~200 mm at least as far as 2.5 m, while in the y-direction it is initially less than 5 mm and diverges at +/−2° or less under most circumstances.

Because the beam is extracted as one continuous ribbon, not a series of beamlets, it can have a very low emittance and consequently deliver such advantages, depending on the application, as ease of focusing, high resolving power in mass-analyzing systems, and accurate delivery to a target. The methods of extracting the ion beam overcome known difficulties of maintaining uniformity and low divergence, and include the formation of very low energy beams suitable for a wide variety of applications: implantation, sputtering, IBAD, and material modification.

☐ In a third alternative use circumstance, the present invention can be closely integrated into the structure of a flange or plate forming a part of the vacuum wall. The ion source typically and routinely will lie disposed within a volume confined and dimension limited, closed vacuum environment which is able to provide an ambient vacuum ranging from about $10^{-2}$ Pa to about $10^{-4}$ Pa, while within the arc chamber of the ion source the pressure is of the order of 1 Pa, these values being determined by the necessary supply of gas to the ion source, and assuming the provision of generous vacuum pumping.

The arc chamber may be attached to and enclosed within structures integrated into the vacuum wall. Furthermore the magnet assembly may be nested on the opposite (atmospheric) side of the vacuum wall and enclose three sides of the arc chamber. Where applicable, this is simpler and more compact than many existing ion source designs.

☐ In a fourth alternative use circumstance, of use where the only desired process gases are gaseous elements, viz. the noble gases, oxygen, and nitrogen, the arc chamber itself may be water-cooled.

☐ In an alternate fifth circumstance, the desired species include elements which can condense on surfaces at room temperature, and elevated temperatures are preferred or essential. In some instances an elevated wall temperature changes the chemistry to favor a particular ion from a mixture of gases/vapors or gaseous molecules. Under these conditions the arc chamber is made of refractory material and is located within a cooled metal heat-shield structure.

☐ In a sixth expected use circumstance, no extraction electrodes or voltage are used, and the plasma is allowed to diffuse out of the ion source, and is used for controlling potentials in an ion beam extracted from another ion source, or on the surfaces of exposed materials.

φ It will be recognized and appreciated, therefore, that the appropriate scope of and proper range of applications for the instant invention is quite extensive and sweeping; that the invention as a whole can accommodate prior art ion beam sources, as well as provide a completely unique and markedly different ion source assembly; and that each original and distinct aspect of the invention presents and provides structural moieties, particular features, and functional capabilities that have never been available in the conventional ion beam sources of the prior art.

II. Pertinent Points of Information

For proper reference as well as for accurate understanding of the essential alignments, different planes and axes, and individual invention components, the following orientations, nomenclature and terminology is presented as the proper language and jargon; is identified accurately and described precisely as to its proper and appropriate usage; and is consistently and uniformly employed hereinafter.

The Arc Discharge Chamber Nomenclature

By definition, a right prism is a three dimensional configuration formed and bounded by two polygonal surfaces which are joined together by a series of lateral planes; and a cross-sectional view of this configuration will result in the exact shape of its two identical ends. In mathematical prism geometry terms, each polygon is traditionally called a "base", and each laterally disposed straight line unit is called a "side".

If the right prismatic shaped arc discharge chamber is a regular and symmetrical geometric form, the chamber can appear in the alternative as a triangular prism, a rectangular prism, a square prism, a pentagonal prism, a hexagonal prism, an octagonal prism, etc. A triangular form is not ideal; a rectangular form is the basis of the discussion but the number of sides could be increased. Thus, as the shape of the polygonal base varies, so will the number of juxtaposed lateral sides. Moreover, while two lateral sides is the minimal number, the true existing number of sides in any single prismatic format can frequently be as great as 8 or 10 laterally juxtaposed sides.

Consequently, for each of these alternative chamber prismatic shapes, there therefore will always be:

(a) Not less than five exterior faces, and six discrete faces, in the rectangular prismatic shaped arc chamber;

(b) Not less than two laterally positioned adjoining sidewalls in the prismatic shaped chamber;

(c) Two contiguous endwalls, in the rectangular prismatic shaped chamber these are bases; and (d) Identifiable, measurable and fixed depth, width, and length dimensions for the prismatic shaped chamber.

Orientations, Dimensions and Cartesian Coordinates Pertaining to the Arc Discharge Chamber It is critical and essential that the practitioner in the technical field always be able to identify and distinguish between the front wall and the back wall of the arc chamber structure; as well as to separate and correctly identify each laterally positioned adjoining sidewall as being different and distinct from each contiguous and abutting endwall in the arc chamber construction.

For proper orientation purposes, that particular exterior face and recognizable solid wall of the prismatic shaped geometry for the rectangular arc discharge chamber which presents the open channels, unobstructed slits, or apertures through which the beam is intended to exit is correctly identified as and will be referred to herein as the 'front' or forward wall; and the directly opposite closed wall and exterior face in the chamber construction is properly referred to as the 'back' or rearward wall. The remainder of the prismatic shaped chamber geometry presents a plurality of oppositely situated and laterally juxtaposed solid adjoining sidewalls identifiable as such; as well as two discernible solid contiguous endwall(s).

Cartesian coordinate axes are also frequently used herein to identify and describe the operative prismatic shaped geometry and functional orientation of the arc discharge chamber. Accordingly for the present invention, the direction extending from the back wall to the front wall of the prismatic shaped arc chamber is the Z-axis and the travel pathway for the extracted ion beam. The minor distance dimension and direction existing between a 1st laterally placed adjoining sidewall and an oppositely situated $2^{nd}$ laterally positioned adjoining sidewall is the Y-axis and presents the width dimension in the arc discharge chamber; and the plane, major distance dimension and direction extending from at least one contiguous endwall (and often to another to the other oppositely placed contiguous endwall side-wall) is the X-axis and arbitrarily chosen length dimension of the arc discharge chamber (corresponding to the breadth dimension of the extracted beam).

The major distance dimension of the prismatic shaped geometry in the arc discharge chamber is the length measurement—which is arbitrarily chosen in size, always extends over and along the X-axis, and is a direct function of and corresponds with the measurable breadth aspect of the extracted ribbon shaped ion beam. This length dimension can arbitrarily be chosen and increased in magnitude at will to almost any meaningful size as desired or needed by the intended application; can range from about 80 mm to more than 3,000 mm; and typically will be about 500 mm to about 2,000 mm in size.

The minor distance dimension of the prismatic shaped geometry in the arc discharge chamber is the width measurement—which is fixed in size and always lies over and along the Y-axis, and corresponds in direction with the thickness aspect of the extracted ribbon-shaped ion beam.

Definitions, Phrasing & Terminology

A 'dipole magnetic field' is the field produced by a pair of poles of opposite polarity. if the poles are quasi-infinite planes, the field is uniform.

A 'quadrupole magnetic field' is the field produced by four poles symmetrically disposed around an axis. The poles alternate in polarity, and in the purest from are assumed to have the shape of a right hyperbolic surface asymptotic to a pair of planes through the origin. In this form, if one plots the magnitude and direction of the field around a circle centered on the origin, the magnitude is found to be constant, but the direction rotates once in passing around the circle. The magnitude of the field is proportional to the radius of the circle.

A 'sextupole magnetic field' is constructed in a similar manner but with six alternating poles, and the hyperbolae are asymptotic to planes inclined 60° to each other instead of 90°. The magnitude of the field is again constant around a circle, but the field direction changes twice in passing round the circle. The magnitude of the field is proportional to the square of the distance from the center.

The terms 'interior faces', 'vertex corners' and 'marginal edges' of the internal cavity volume in the arc discharge chamber geometry are consistently identified and recognized as being individually distinguishable internal cavity volume locations, which are: Those spatial areas existing between a 1st laterally positioned adjoining sidewall and the back wall; and a second separate internal spatial area which concurrently exists between an oppositely situated $2^{nd}$ laterally positioned adjoining sidewall and the back wall. The corner may or may not have a fillet radius.

It is also self-evident that these terms—'interior faces', 'vertex corners' and 'marginal edges'—pertain to the spatial relationships existing between each of the two laterally positioned adjoining sidewalls with the front and backs walls respectively; and the endwalls as such of the arc chamber are not involved in identifying what are these portions of the internal cavity volume

III. The Operative Improved Ion Source

In all intended applications and alternative circumstances of use, the present invention is an improved ion source wherein at least one gaseous substance is ionized into a plasma state within an arc discharge chamber and a resulting ribbon-shaped charged ion beam is extracted, the beam then traveling in the Z-axis direction. However, to achieve its purpose, the improved ion beam source will comprise and include not less than at least two discrete structural moieties—a prismatic-shaped arc discharge chamber and a primary electrode trap assembly.

In prior art practice, an ion beam may be obtained by using a conventional triode or tetrode beam formation system. In these conventional systems however, owing to the need to maintain very small levels of variation of the electrode spacing—combined with the production of an arbitrarily large sized bream breadth in the presence of substantial heating by beam collision, radiation, and other heat mechanisms—there are multiple substantive challenges which must be confronted and directly addressed. These well recognized multiple substantive challenges are confronted and solved by the present invention disclosed below, as exemplified and illustrated by the different embodiments described in detail herein.

A. The Prismatic-Shaped Arc Discharge Chamber

The Prism Geometry of the Chamber

¶ The arc discharge chamber is preferably a preformed, rectangular prism-shaped, solid-wall closed box fabricated of a conductive material, such as a refractory material; or else is an actively cooled structure, such as cooling by means of internal water passages.

The arc chamber geometry desirably has the shape of a rectangular prism, inside which a confined cavity space exists; and from which the ion beam will emerge. As a rectangular prism, its configured box geometry includes a front wall having at least one exit aperture, a back wall, two oppositely situated and laterally placed adjoining sidewalls, and two discrete and oppositely located contiguous endwalls. Bounded within this geometric construction is an internal cavity space which is confined in volume and limited in its configured dimensions.

¶ The overall box geometry of the rectangular prism arc chamber is elongated in the X-axis direction and has an internal cavity volume which is suitable for the at-will introduction therein of a pre-chosen gaseous substance, which is ionized in-situ into a plasma state. For gas ionization purposes, the internal cavity volume configuration is typically either rectangular or rounded in cross-sectional shape; but can be configured in almost any shaped format whenever needed or desired.

Typically, the box-like geometry of the chamber will have internal size dimensions in which the two oppositely situated and laterally positioned adjoining sidewalls of the chamber are about 20-50 mm apart in width along the Y-axis direction, and extend about 20-50 mm in depth from the front wall to the back wall in the Z-axis direction; while the internal spacing between the two contiguous and abutting endwalls will vary from about 80 millimeters to 3 meters or more in measurable length along the X-axis direction.

Traditionally, that wall of the arc discharge chamber containing the exit aperture is referred to as the 'front'. The front wall of the chamber will contain at least one elongated exit aperture running in the X-axis direction; and provide for the egress of ions from the plasma, an egress which can be accelerated and be formed to emerge as a ribbon beam.

¶ The arc chamber box may be constructed in a variety of different ways; but a preferred technique is to fabricate two identical or near-identical discrete halves or split-sections, the split passing through the exit aperture. It would be possible to substitute an array of open slots or channels for one continuous exit aperture. When the length of the arc chamber exceeds about 1 m and a continuous open slot is used, maintaining the wall portions of the slot opening in parallel, in good alignment, and uniformly together is challenging; and for this reason, the specific embodiments described below directly address this challenge. Internal corners may be rounded in shape.

The Heated Cathode(s)

A heated cathode able to emit primary electrons is provided and lies tangibly disposed at one identifiable interior end wall face within the cavity volume of the arc discharge chamber.

As is described more fully below, the quadrupole magnetic field shape will include four line-cusps, three of which are near the externally located magnetic poles. It is necessary for correct functioning of the ion trap that the magnetic field lines at these four cusps intersect defined potential surfaces which are at or negative with respect to the cathode potential; and for simplicity this potential value may be defined and provided by the arc chamber walls. To meet this requirement the heated cathode will have the a potential value between 0 and about 5V positive with respect to the measurable potential of the arc chamber.

Cathode Operation and Function

Typically, the cathode disposed at one end wall of the arc chamber is heated electrically until it emits a stream of moving electrons into the cavity volume of the arc chamber; and those initially emitted electrons are often referred to as 'primary electrons'. Other kinds of electrons are also present, including those primary electrons which have lost significant energy in an inelastic collision with an atom, electrons detached in such collisions, and electrons detached from the walls by ion impacts; and these are typically referred to as 'secondary electrons'.

For a very long arc chamber, an additional cathode may be placed at the opposite end, and if required an intermediate cathode or cathodes may be used. The cathode may be an electrically heated filament of tungsten or tungsten alloy; or it may be an indirectly heated cathode, or be a more massive cathode—such as that shown in FIG. 7b which is a 6 mm thick block of tungsten cut to form an interdigitated shape which can be directly electrically heated. The cathode is located so that the null field axis passes through it near its center, a circumstance which ensures that the primary electrons encompass this axis and are correctly trapped. The arc current can be regulated by adjusting the power delivered to the cathode.

Figure 11:
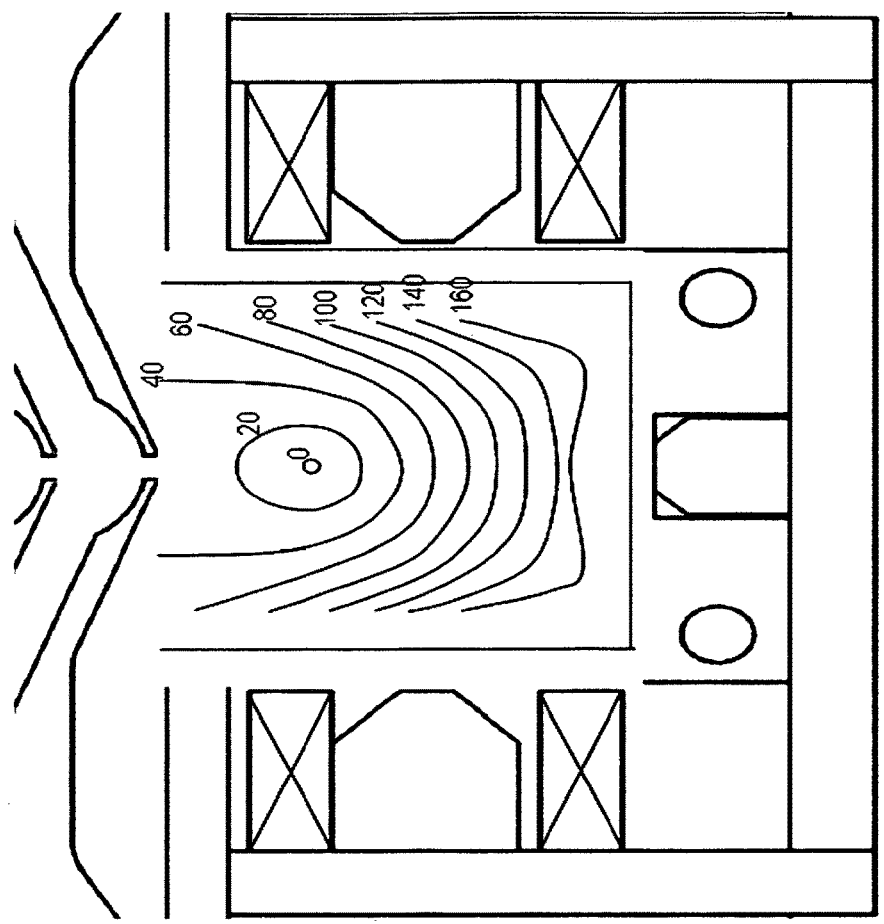
FIG. 11 shows contours of magnetic field strength, and the null point at zero value in the magnetic field, superimposed on the cross section of the arc discharge chamber in the 1$^{st}$ functional embodiment shown by FIG. 4.

Preferably the total ion current is measured, and this signal is compared to a reference signal; and the difference is used to adjust the cathode temperature, hence the arc current, hence the ion beam current. The cathode should present a large area to substantially overlay the area in which electrons can be trapped, as shown in FIG. 11.

The Rod-Shaped Anode(S)

The anode will typically take the form of one or more rods, bars or shafts which extend along the X-axis and run over the full length dimension of the arc chamber. The anode structure may, for example, extend through holes to a pair of mounting locations which lie external to the arc chamber structure. The rod-shaped anodes are individually connected to the positive terminal of an arc power supply, whose negative terminal is then connected to the cathode and to the arc chamber. This supply can be adjusted to supply many amperes at 40 to about 120V.

Anode Placement within the Cavity Volume

£ It is essential that the primary electrons emitted from the cathode cannot directly reach the anode(s) then disposed within the cavity volume—so that the primary electrons may become spatially trapped within the central spatial zone of the cavity volume; and then pass back and forth repetitiously within the central spatial zone of the cavity volume until the electrons suffer an inelastic collision with a gas atom or molecule, lose energy, and create charged ions in-situ.

Figure 10:
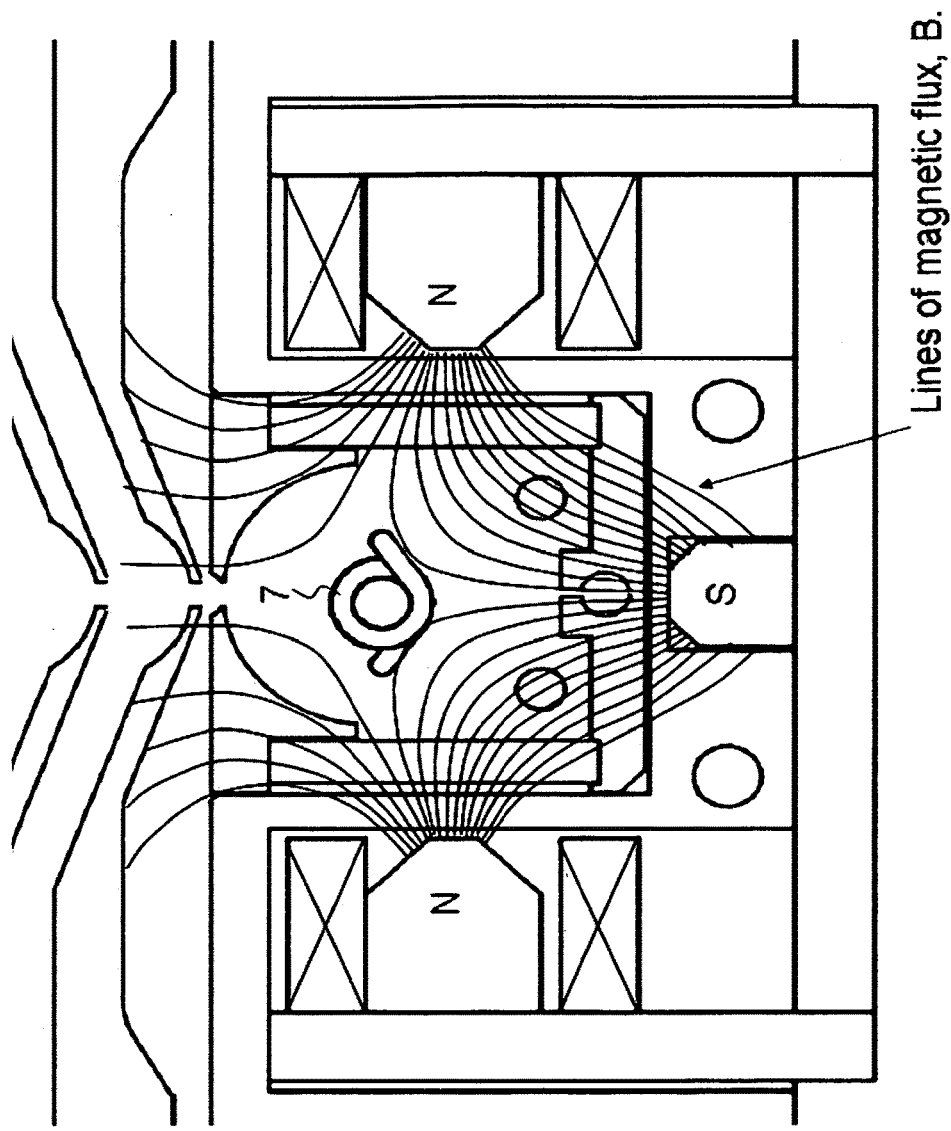
FIG. 10 shows the lines of magnetic flux superimposed over a cross-section of the arc discharge chamber in the 1$^{st}$ functional embodiment shown by FIG. 4.

The anode rod(s) must therefore be tangibly located close to the inner face surfaces of one or more laterally positioned adjoining sidewalls within the chamber's cavity volume, wherein the quadrupole magnetic field lines isolate and separate it (or them) from the central spatial zone of the cavity volume—i.e., that spatial region into which the primary electrons are initially emitted by the cathode. This circumstance is illustrated by FIG. 10 which shows several magnetic flux lines passing between the anode rods and the central spatial zone.

Figure 12:
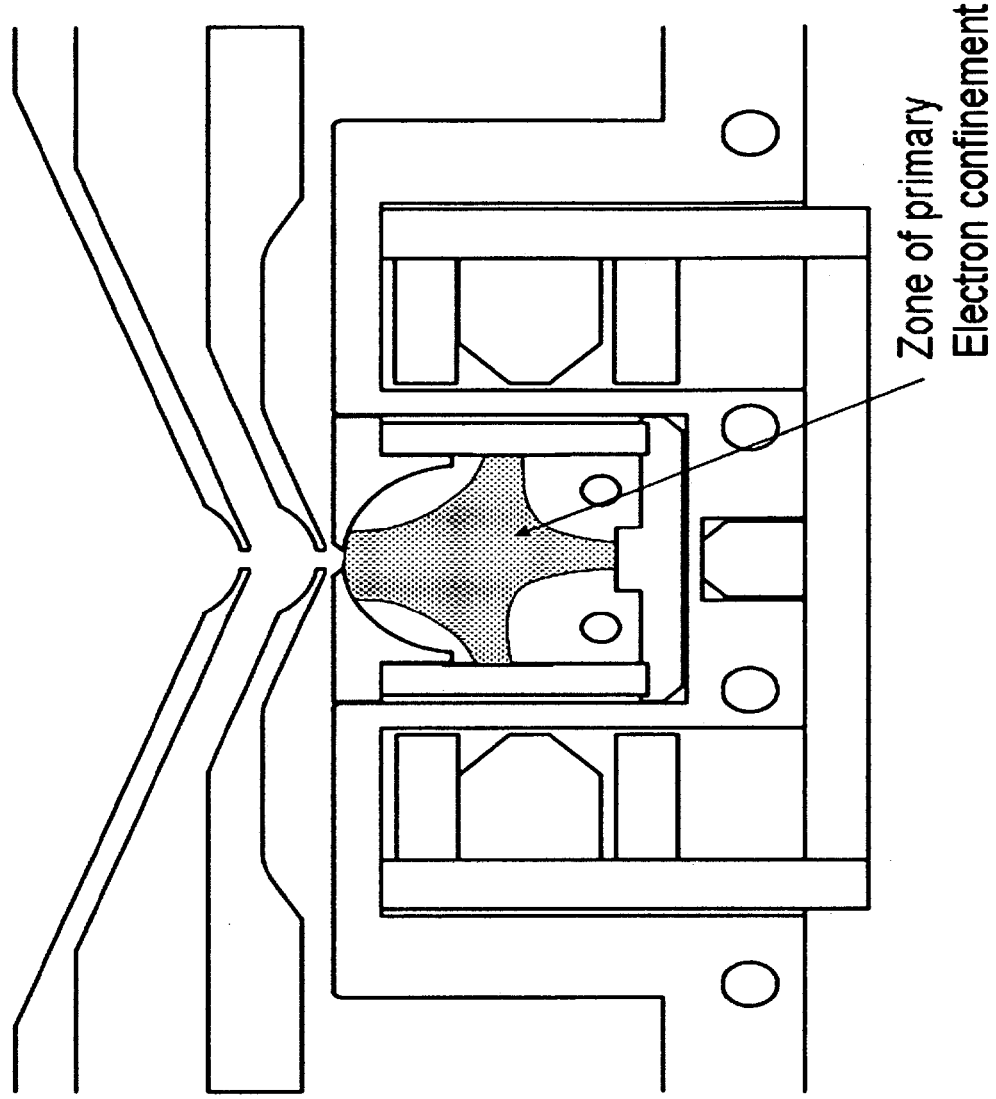
FIG. 12 shows a portion of the spatial zone within the cavity volume of the arc discharge chamber in which primary electrons from the thermionic cathode are trapped by the combined magnetic fields, superimposed on the cross section of the arc discharge chamber in the 1$^{st}$ functional embodiment shown by FIG. 4.

£ The particular placement of the rod-shaped anode(s) and its territorial interaction with the discernible quadrupole magnetic field then existing within the cavity volume of the arc chamber forms the magnetic electron trap circumstance and initiates the primary electron trapping event—by confining the moving primary electrons to a four-lobed central spatial zone (as illustrated in FIG. 12).

The installed quadrupole magnetic field serves an essential operating role by preventing the moving primary electrons from reaching the rod-shaped anode(s) then positioned upon the inner wall face(s) of the laterally positioned adjoining sidewall(s). of the arc chamber; and provides a magnetic trapping effect by redirecting electrons away from the rod-shaped anode(s) and effectively confining all the moving electrons (both the primary electrons and the secondary electrons) to the four-lobed central spatial zone of the cavity volume.

£ The magnetic field protection created for the disposed rod-shaped anode(s) is very effective: After the trapped electrons have lost some energy, the probability for large-angle repulsive elastic scattering from other electrons will rise in inverse proportion to their velocity; and the trapped electrons will more rapidly share their energy and reach a thermal equilibrium within the confines of the spatial magnetic trap. Inelastic collision processes also play a substantive role for the electrons moving within the discernible limits of the magnetic trap.

In addition, the increased rate of scattering permits a few of the moving electrons to diffuse across the magnetic field lines and actually reach the rod-shaped anode. Thus, the electron current supplied to the anode(s) is very largely constituted of electrons which have successfully ionized an ion specie, plus the electrons detached from the ions, which have lost sufficient energy to diffuse effectively. The observed current is greater than, but proportional to, the number of ions created.

Introduction of an Ionizable Gas

A prechosen gas is introduced into the internal cavity volume through a plurality of small holes or controlled orifices in the solid walls of the arc chamber for ionization purposes. The current density of ions generated from this introduced gas depends upon the local chamber pressure; and in a very long and narrow arc chamber front wall with an open exit slit, it is very possible to vary the pressure within the chamber's cavity volume by changing the flow rate of gas passing through each controlled orifice.

Thus, the uniformity of the current density in the broad breadth ion beam which is extracted from the arc chamber can be adjusted by adjusting the flow speed of gas through each hole passageway. However, the total flow rate of gas would need to bear a more-or-less constant relationship to the total ion current required.

Removal of Heat Generated within the Arc Discharge Chamber Structure

The power delivered to the arc discharge chamber can reach or exceed 100V×3 A per 100 mm of length, which is of the order of 1 kW per 300 mm of arc chamber length plus an additional 600 W. In ordinary operation therefore, the arc chamber may reach several hundred degrees C.° of heat, unless the chamber is actively cooled.

The practitioner can choose whether to let the arc chamber run hot, or actively cool the chamber with cold water passageways. But always in the present invention, it is mandatory that this heat be prevented from reaching the magnets—because permanent magnets lose their magnetization, and electrical coils lose their electrical insulation, if the temperature rises to a fraction of the arc chamber temperatures.

To this end, a cooling metal envelope must lie between the arc discharge chamber structure and any adjacently surrounding magnetic field generating yoke subassembly. There are several possible methods of accomplishing this end, and three concrete examples are included herein.

Extraction Electrodes

Figure 4:
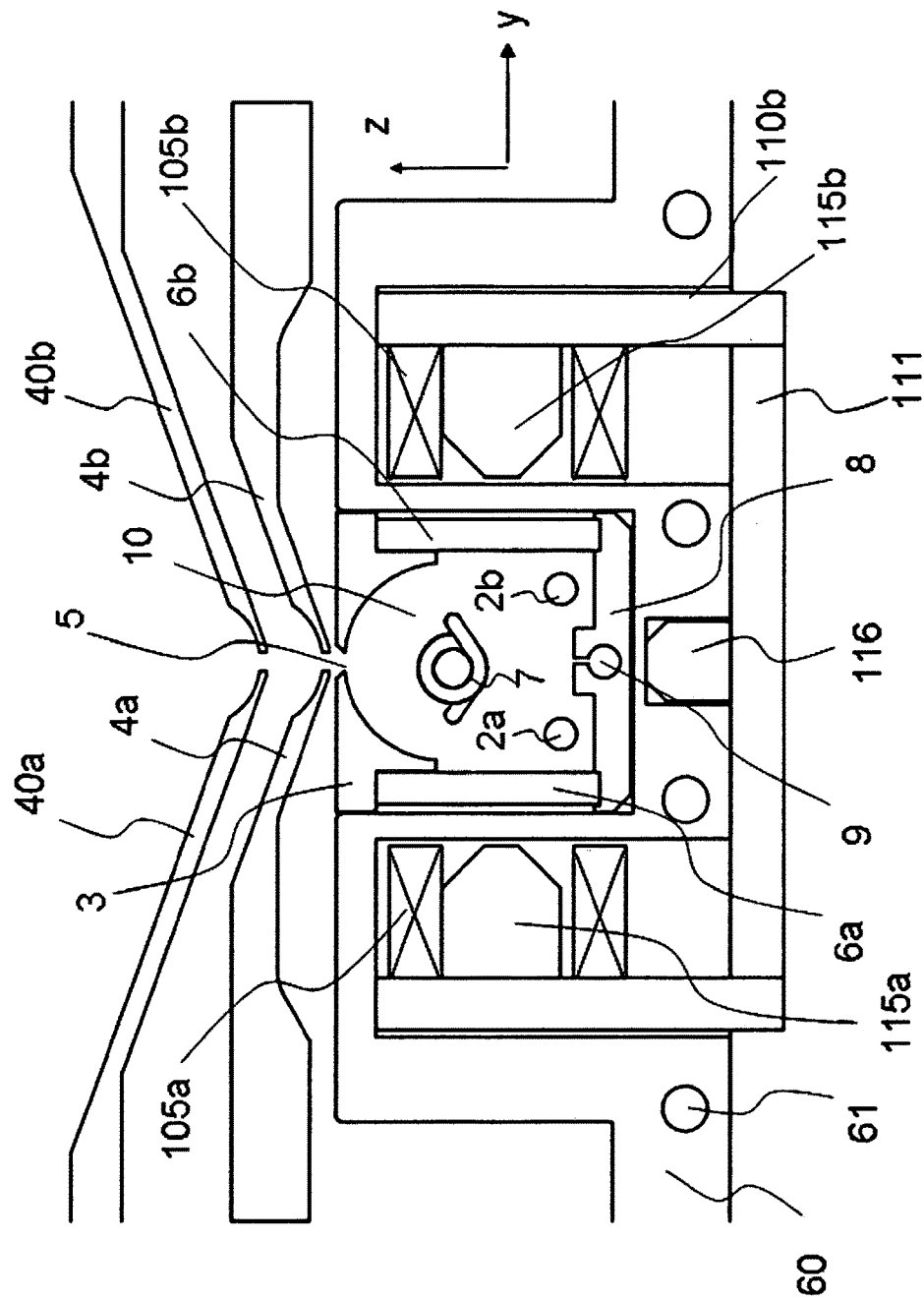
FIG. 4 is a cross sectional view of a 1$^{st}$ functional embodiment of the improved source assembly.

¥ A conventional triode extraction system for ion beam extractions is shown by FIG. 4 (as well as other figures of the Drawing). For certain applications such as ion implantation where the energy and current range of operation requirements is very large, the use of a tetrode extraction system has certain advantages:
• The length of the electrodes in the X-axis direction must exceed the beam breadth dimension.
• Thermal expansion makes it difficult to maintain a constant beam shape, but small deviations in electrode shape produce large changes in beam divergence, because of the sensitivity to precise dimensional control (discussed below). To maintain dimensional stability, the stack of electrodes can be mounted to the front of the ion source on precision ground ceramic insulators.
• The insulators are well shielded by metal cups to prevent fast coating of their surface with conductive films such as those sputtered by the beam from the electrodes through imperfect beam transmission.
• Each extraction electrode is made as two independent halves, each mounted to its own array of insulators. The electrodes are aligned to the standoff insulators using pin-in-slot alignment, so that thermal expansion of the electrode parallel to the ion source slot is permitted, and does not cause significant electrode stress or buckling.

¥ The Child Langmuir law states that for a flat ion emitting surface, the current density is related to other parameters as follows:

$$J = (4\epsilon_0/9)(2q/M)^{1/2} V_1^{3/2} g^2$$

where J is the current density, $\epsilon_0$ is the permittivity of free space, q is the charge on each ion, M is its mass, V is the voltage across the first acceleration gap, and g is the gap between the ion emitting surface and the first extraction electrode.

This equation is difficult to apply to a plasma extraction system because the emitting surface is neither flat nor located in one fixed position—the plasma boundary from which the ions are emitted shifts depending on the various parameters so that the emitting surface is the fitting parameter to ensure that the equation is locally accurate. The current density must also match the ion production rate in the plasma.

As a result, the divergence of the ion beam is a sensitive function of the parameters in the equation. If the current density available from the plasma increases, the plasma boundary will move forward and eventually bulge from the extraction aperture or slot. The ion trajectories are strongly influenced in their initial direction by this effect.

¥ However it will always be approximately true that the lowest divergence ion beam is formed by a slightly concave plasma surface, which will form when the current density is slightly lower current density than the equation requires for a plane surface. The practical current density at minimum divergence from a plasma ion source is slightly less than the Child Langmuir law gives assuming a planar plasma boundary. Once one operating point is well-established, others can be calculated. The equation will have the form:

$$I_{max} = lw/g^2 V_1^{3/2} (4\epsilon_0/9)(2q/M)^{1/2}$$

where w is the slot width, l is the slot length, and g is the electrode gap, which cannot be less than about 1.5 w in practice, and the numerical factor will always be modified by geometrical shape issues.

¥ If the beam current is raised, the voltage across the first extraction gap must be raised, in order to satisfy the scaling of this equation. The electrode spacing must be selected so that the equation can be met across the range of operating conditions. If this range is wide, the use of a four-electrode system (tetrode system) in place of the triode system shown in the figures, is advisable.

¥ For very low beam energies, the extraction voltage (the voltage across the first gap), which is the sum of the voltages on the two power supplies in FIG. 1, may be 1 to 5 kV, but the beam is then decelerated in the second gap to a final energy as low as 50 eV. Under these conditions the precise gaps between the electrodes must be well controlled and tailored to the specific conditions, and optimization of the shape of the electrodes using computer codes such as OPERA/SCALA is advisable.

B. The Primary Electron Trap Assembly

The Magnetic Field Generating Yoke Subassembly

A discrete quadrupole magnetic field with a uniform cross section in the X-axis direction is provided and installed internally within the configured cavity volume along the length dimension and X-axis of the plasma chamber via an adjacently disposed magnetic field generating yoke subassembly.

The open yoke subassembly uses a multipole array of at least three, and sometimes four or more, discrete magnetic pole constructs of alternating polarity. These pole constructs demonstrate an alternating polarity; and are individually disposed in series over and along an open supporting yoke framework. The resulting yoke subassembly can generate a discernible quadrupole magnetic field on-demand—and will provide a field which is sometimes slightly distorted by the presence of a significant sextupole component, so as to be weaker in the Z-axis direction of beam extraction.

It is noted particularly here that a suitable yoke subassembly fully operative to generate a discernible quadrupole magnetic field on-demand may be fabricated using only three discrete magnetic poles in series, which are disposed apart from each other upon a substantially U-shaped yoke frame. Moreover, a variety of other different yoked structural arrangements, arrays, and multipole displays which utilize three, or four, or even greater numbers of discrete magnetic pole constructs of alternating polarity in series may be employed at will.

Thus, the sole essential requirement for any of these alternative formats and designs is that the open yoke subassembly be functionally able to generate and install a discernible quadrupole magnetic field on-demand within the internal cavity volume of the arc discharge chamber.

It must be borne in mind also that the requirement for a clear and unobstructed path for the extracted ion beam mandates that no magnetic pole be disposed close to or lie forward of the front wall face of the arc chamber. Accordingly, any three-sided yoke subassembly which can generate significant quadrupole field components and weak sextupole field components will meet and satisfy the requirement.

The Different Classes of Moving Electrons

Figure 2:
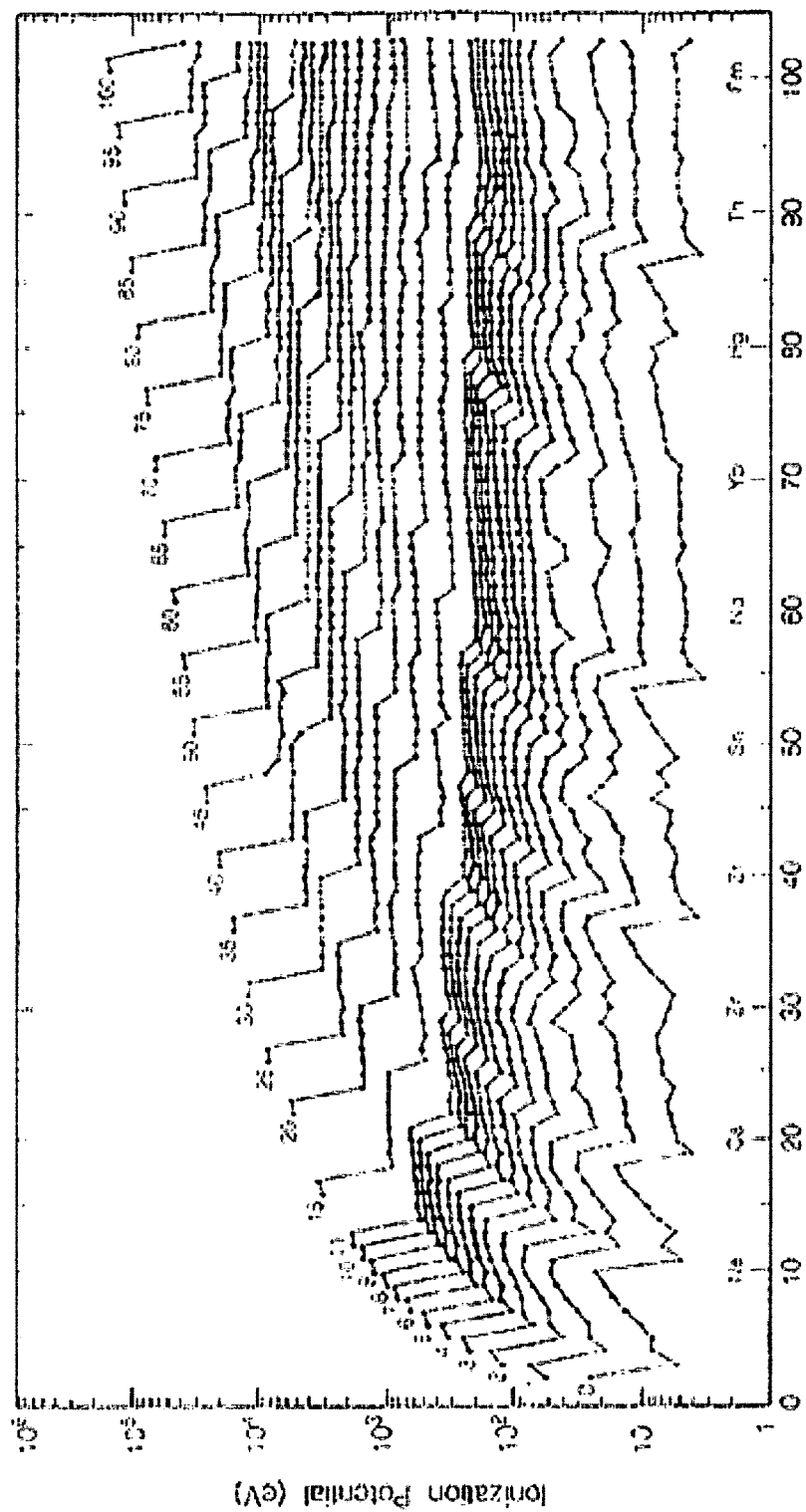
FIG. 2 is a graph illustrating the ionization potentials for different atom species and shows the evolution of ionization potential against charge state for the atom species.
Figure 3:
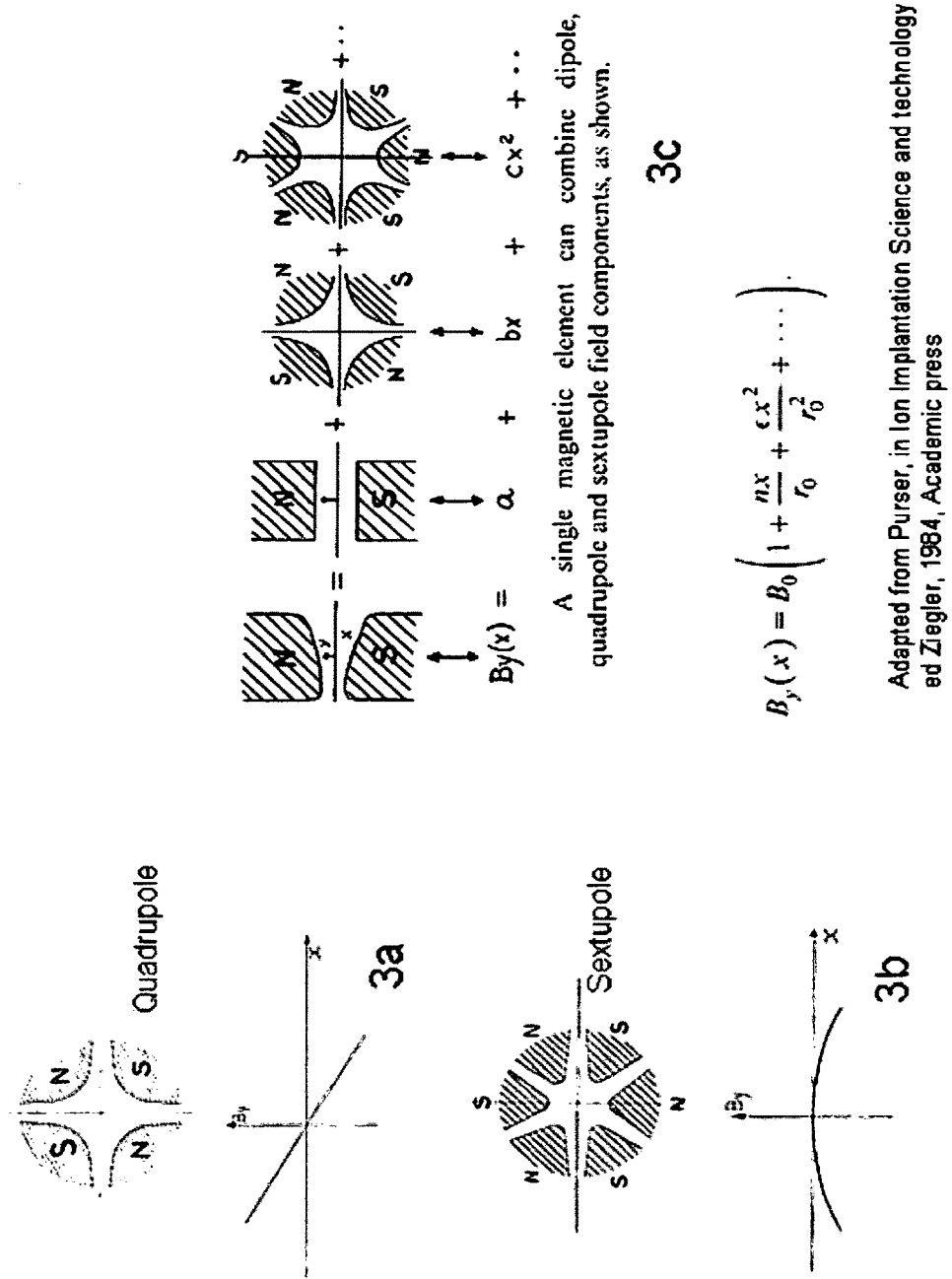
FIG. 3a is a schematic representation of a quadrupole magnetic field.
FIG. 3b is a schematic representation of a sextupole magnetic field.
FIG. 3c is a schematic representation of the manner in which different multipole magnetic field configurations may be superimposed

Ionization requires a collision between a gas atom and an energetic electron with at least the threshold energy given in FIG. 2. Cross-section values for ionization are a measure of the probability for ionization under certain given conditions. One source of such data is publications by NIST.

The cross sections for ionization for various gases tend to be greatest for electron energies around 60 to 100 eV—i.e., 4 or 5 times the threshold for ionization. For this reason, primary electrons are effective to ionize the gas, but secondary electrons are not. The background plasma typically has an electron temperature of 1 to 2 eV, and such electrons cannot act to and do not ionize the gas molecules in-situ.

The Trapping of Primary Electrons

It is important to understand fully the mode and manner of primary electron trapping which occurs within the internal cavity volume of the arc chamber. The electric potential within the cavity space is generally slightly positive in value, because of the presence of the anode rod(s); and because once a plasma state is established in-situ—the chamber volume is filled full of plasma to within <1 mm distance of the inner wall faces; and as is well known, the plasma tends to reach an equilibrium potential somewhat positive with respect to the anode.

φ The quadrupole magnetic field is now imposed on this electrostatic field arrangement: The quadrupole fields lie parallel to the Y-Z lane but extend uniformly along the X-axis direction over the full length dimension of the cavity volume; and the magnetic field has a null value along an approximate center or midline of the cavity configuration which runs the entire measurable length of the chamber (in the position shown by the number zero or "0" in FIG. 11), and is referred to herein as the null field axis.

φ The highly non-uniform quadrupole field which extends over the length dimension of the cavity volume—as is well-known—has the effect of focusing a moving charged particle toward the null line in two opposite quadrants of the magnetic field, and concurrently also of defocusing a moving charged particle in the opposite two quadrants.

φ Toward the outer edges of the plasma, there is a weak electric field generally directed away from the center of the plasma, and this tends to accelerate electrons inwardly. In certain locations, this electric field is orthogonal (or nearly so) to the magnetic field lines; and, as a result, the electron cycloidal motion will be impelled toward one end of the arc chamber at a measurable drift velocity which is mathematically calculated as V=E/B.

In alternating quadrants of the magnetic field, the drift velocity direction reverses. This reversing drift velocity tends to enhance the mixing and uniformity of the distribution of primary electrons. Unlike the ALPA source where the electrons can drift indefinitely in a close orbit—at the arc chamber walls, the drifting electrons are reflected somewhat randomly from the inner wall faces. By modeling, one knows that their motion is somewhat chaotic and that drifting electrons transition with a high probability to another region of the trapped distribution, where they can drift in the opposite direction.

φ A moving primary electron introduced on this null line once a plasma is established encounters essentially zero electric or magnetic fields, so is free to travel the full length of the arc chamber undeflected; but upon approaching the inner face of a contiguous endwall, it will be electrostatically reflected, re-directed, and returned toward the center of the internal cavity volume. Accordingly, the cathode is always placed so as to encompass the null field axis. However a moving electron which is displaced from this central null line of the cavity volume will encounter and become deflected by the quadrupole magnetic field.

φ Consequently, all primary electrons emitted from the cathode and encountering the quadrupole magnetic field within the confined cavity column of the arc chamber will exhibit the following characteristics:

(α) The primary electrons are accelerated toward the anode rod(s) and/or toward the center of the of the plasma formed by electron-impact ionization within the arc chamber;

(β) The primary electrons have insufficient kinetic energy to reach any part of the arc chamber walls except the anode rod(s);

(γ) The primary electrons are deflected by the quadrupole magnetic field. Depending on their location within the field, they may be deflected towards or away from the null field axis. Those deflected away from the null field axis are increasingly rapidly deflected with a gyro-radius many times smaller than the distance of the anode rod(s) from the zero-strength field line, and are directed into cycloidal and oscillatory paths which cannot intersect the anode rod(s);

(δ) The primary electrons are imparted with a positive or negative X-axis directed motion [referred to as a drift velocity of magnitude E/B] in regions of crossed electric and magnetic field;

(ε) The primary electrons are prevented from reaching the solid chamber walls because the electrostatic potential of the walls is a negative value with respect to the potential of the cathode; and φ The primary electrons become trapped in a central cross-shaped zone and are uniformly distributed along the length dimension of the cavity space by the combination of electrostatic and magnetic confinement and the axially directed E×B drift.

φ Accordingly in this instance, the field strength will be sufficient in magnitude that the defocused electrons are deflected to move in a cycloidal path, and cannot escape the central spatial zone. The fields have insufficient strength to have a significant effect upon the heavier ions, which thus are free to strike the walls or exit the arc chamber through the aperture. Also, the quadrants are separated by surfaces coplanar with the field lines and passing through the null line.

φ Furthermore, as illustrated by FIG. 12, the circumstance and effect of primary electron trapping presents a visibly asymmetric shape. This asymmetric shape applies to moving electrons then traveling into the plane of the diagram; and moving electrons then traveling out of that plane which become trapped in a cavity spatial zone with mirror-image asymmetry.

φ Since electrons are reflected from the inner faces of both contiguous endwalls of the chamber repeatedly, many multiple times, the overall configuration of the trapping volume is symmetric; and comprises the asymmetric shaped spatial zone (illustrated by FIG. 12) superimposed upon its own reflection in the central X-Z plane of symmetry.

A further consideration is that these electron travel pathways are highly convoluted and often looped; and that the electrons will travel a distance of about 3 cm for each 1 cm of net progress within the arc chamber over the X-axis direction. This travel distance increases the probability of an ionizing collision in each passage over the length dimension of the arc chamber.

No Requirement for Magnetic Cusp Field Plasma Confinement

§ It is recognized here also that magnetic cusp field plasma confinement has been used in the technical field for many years; but in the present instance, one can reduce the need for high magnetic fields and simultaneously improve the trapping efficiency by choosing not to rely upon the magnetic cusps of the multipole field for electron reflection. The present improved ion source is therefore fundamentally different from conventionally known constructions [such as those exemplified by K. N. Leung, *Multicusp Ion Sources*, *Proc.* 5th. Int. Conf. Ion Sources, Beijing, 1983, Rev. Sci. Inst., 65:1165 (1984)].

Accordingly, instead of relying on cusp confinement, the present invention is so arranged that each of the weak magnetic cusps of the magnetic field also coincides with a solid metal wall at the most negative potential within the cavity volume of the arc chamber. In this way, the primary electrons emitted by and flowing from the cathode are electrostatically trapped, and the magnitude of the quadrupole magnetic field requirement becomes markedly reduced.

The Installed Quadrupole Magnetic Field

¶ The installed quadrupole magnetic field of the primary electron trap assembly, even if somewhat distorted, will extend uniformly within the chamber's internal cavity volume in the X-axis direction over the full linear length dimension of the arc chamber. The true extent of the discernible quadrupole magnetic field will thus vary directly with the linear length dimension of the arc chamber; and, as the prechosen length dimension of the arc chamber is arbitrarily increased from about 80 mm to more than 3,000 mm, the linear length of the ensconced quadrupole magnetic field within the internal cavity volume of the arc chamber will correspondingly increase in size. Because of the field orientation, this circumstance requires no increase in ampere turns for the wire winding coils; or if permanent magnets are used, no increase in the size of the permanent magnets used, but merely an increased number of permanent magnets in a linear array.

¶ The discernible quadrupole magnetic field which is installed and extends within the limited confines of the cavity volume in the arc chamber effectively functions as a volumetric shield of magnetic flux lines which overlies and encompasses the anode potential (tangibly appearing as long length anode rods). It is not very effective at trapping electrons at the magnetic cusp zones; but in these zones, one elects to provide a negative electrostatic potential.

Via this arrangement and in this manner, the installed volumetric shield of magnetic field lines acts in combination with the selected electrostatic wall potential and together effectively function as a primary electron trap, confining the primary electrons to a defined volume within the limited confines of the cavity volume of the arc chamber.

¶ The discernible quadrupole magnetic field generated by the primary electron trap assembly and installed within the internal cavity volume of the arc discharge chamber will demonstrate and provide the following traits and properties:

(i) The installed quadrupole magnetic field will extend uniformly along the X-axis direction (i.e., over the length dimension of the arc chamber);

(ii) The ensconced quadrupole magnetic field has Y-axis and Z-axis directed field components, but presents no significant X-axis component;

(iii) In a Y-Z cross section view, the instituted quadrupole magnetic field has a zero strength and a central null axis parallel to the X-axis which extends over the full length dimension of the arc discharge chamber and beyond, and is referred to as the null field axis;

(iv) The field strength of the invested quadrupole magnetic field increases continuously with increasing distance from the central null axis to the laterally positioned adjoining sidewalls walls of the arc discharge chamber;

(v) The established quadrupole magnetic field will cause an individual high strength magnetic field to pass over and along at least two peripheral spatial regions existing at the interior corners and marginal edges of the cavity volume in the arc discharge chamber;

(vi) The lodged quadrupole magnetic field is coplanar with and extends over any plane which is normal (i.e., lying perpendicular or at 90 degrees) to the arbitrarily chosen length dimension and X-axis of the arc discharge chamber; and (vii) The emplaced quadrupole magnetic field will not create or cause any magnetic field or field component to lie along or be parallel to the arbitrarily chosen length dimension and the X-axis of the arc discharge chamber box

C. The Extracted Ion Beam

§ Via the markedly improved ion source described above, the user is provided with a broad breadth ion beam which then can be employed in a number of different applications. In each instance, a streaming ribbon-shaped ion beam is produced which has a measurable breadth dimension which is at least ten times greater than its width dimension, and preferably is thirty or more times greater than its width dimension—the breadth and width dimensions of the extracted broad breadth beam being normal to the Z-axis direction of travel for the beam.

§ In addition to its broad breadth range, the extracted ion beam will present a number of traits and properties which can be chosen in advanced as desired or need. Accordingly, the general characteristics of the stream of ions which can be extracted as a beam from the present ion source will include all of those factors and variables listed by Table 1 below.

TABLE 1

| Ion Beam Property Variables | |
| --- | --- |
| Ion beam breadth range: | From about 80 mm to more than 3,000 mm. |
| Ion divergence: | At energies above about 3 keV: +/−2°; At lower energies, this value is greater. |
| Ion energy range: | From about 20.0 eV to about 100,000 eV using triode or tetrode beam extraction; Thermal plasma at 1 to 20 eV with no extraction voltage |
| Ion current range: | From about 0.001 to about 1 amperes of positive ions per meter of ion source length. |
| Ion current power range: | With suitable beam acceleration, beam powers of >100 kW; Applications may require up to 10 kw. |
| Ion energy distribution range: | For monatomic species: ~2 eV FWHM; For dissociated molecular species: <10 eV FWHM, depending on the molecular chemistry of the species. |

Within these general ranges, a highly preferred set of values for ion implantation purposes is presented by Table 2 below.

TABLE 2

Preferred Beam Properties For Commercial Ion Implantation Purposes

| | |
|---|---|
| Ion beam breadth range: | From about 150 mm to about 2,500 mm |
| Ion divergence range: | +/−2° |
| Ion energy range: | From about 5 keV to about 80 keV |
| Ion current range: | From about 0.001 A to about 0.1 A per meter of positive ions |
| Ion current power range: | From 50 W to about 22 kW |
| Ion resolving power M/ΔM FWHM: | 20 is acceptable; 40 is good. |

IV. A First Functional Embodiment of the Invention

In this first embodiment, the improved ion source can produce a ribbon shaped ion beam having a breadth dimension of 200 to 2500 mm, and thickness on leaving the extraction electrodes of about 5 mm, diverging at +/−2 degrees, the beam's breadth and thickness dimensions being measured normal to the Z-axis pathway and travel direction of the ion beam.

However, owing to its typical operative format within vacuum and ambient air environments concurrently, the minimal components of the improved ion source will also include an environment-separating, intervening partition barrier in combination with the arc discharge chamber and the magnetic field generating yoke subassembly of the primary electron trap assembly.

Thus, in this 1st embodiment of the improved ion source, an environment-separating partition barrier is used to divide, segregate and isolate the arc discharge chamber, then held within a high vacuum environment; and to physically separate the adjacently located and surrounding magnetic field generating yoke subassembly, then typically held in the ambient air environment.

A. The Structural Entities

Figure 5B:
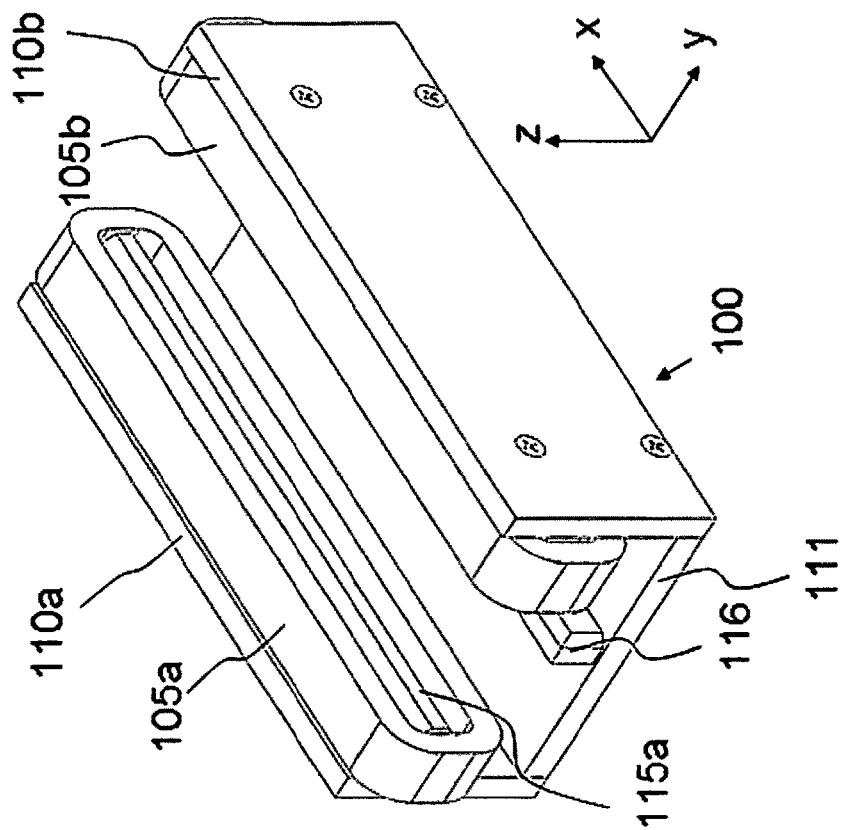
FIG. 5b is a perspective overhead view of the magnetic field generating yoke subassembly in the 1$^{st}$ functional embodiment of FIG. 4.
Figure 5A:
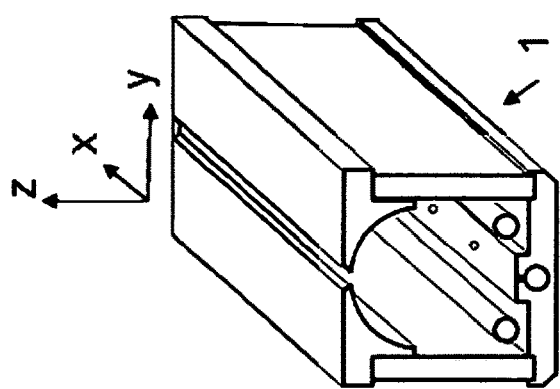
FIG. 5a is a perspective sectional view of the arc discharge chamber in the 1$^{st}$ functional embodiment of FIG. 4.
Figure 6:
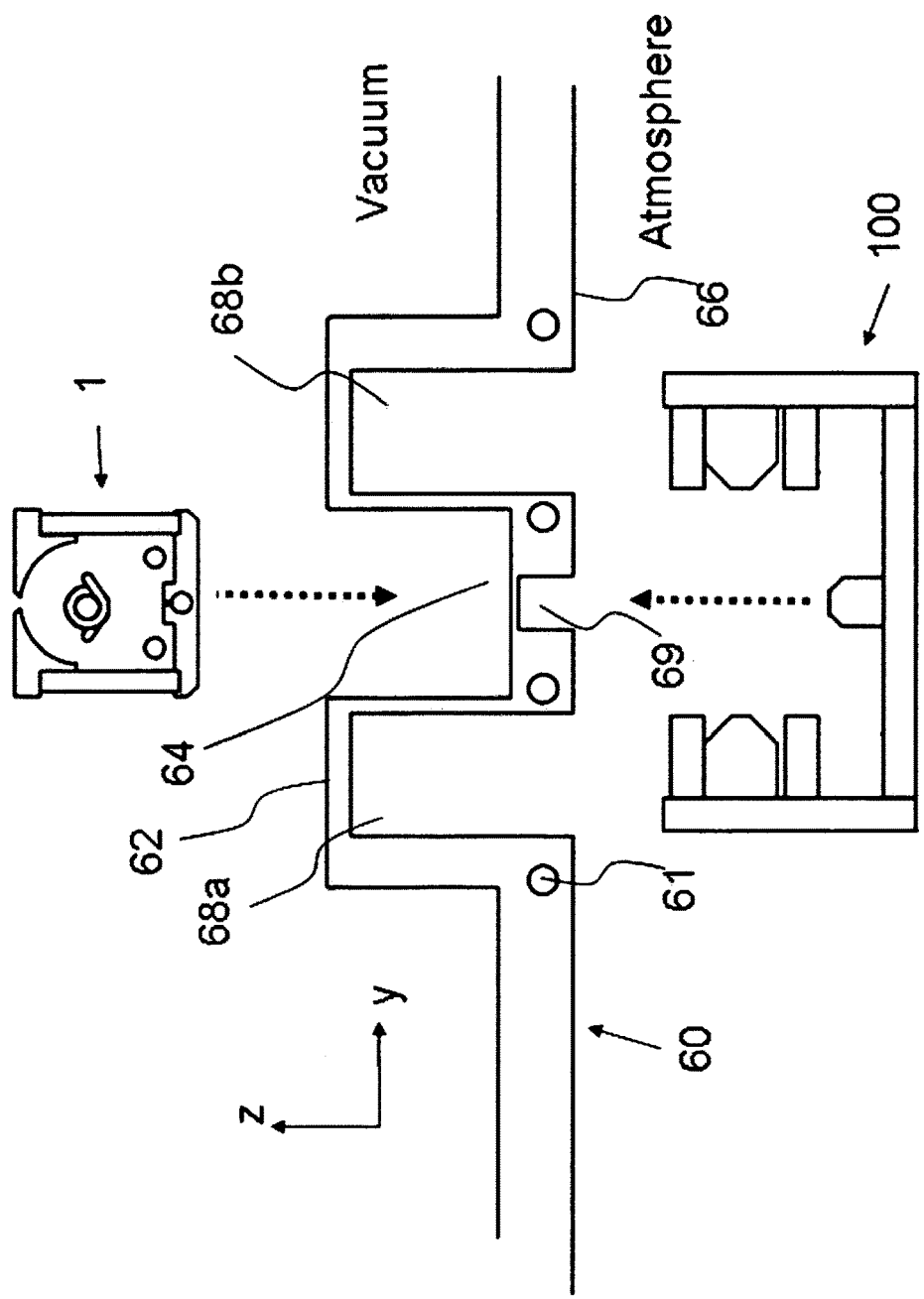
FIG. 6 is an exploded section view showing the structural arrangements of and aligned inter-fittings for the arc discharge chamber and the primary electron trap assembly, comprised of an intervening partition barrier and the magnetic field generating yoke subassembly, in the 1$^{st}$ functional embodiment of FIG. 4.

£ In this first embodiment shown by FIGS. 4, 5, and 6 respectively, there are two essential structural entities which are carefully aligned and joined together. These are: (a) An arc discharge chamber; and (b) a primary electrode trap assembling comprised of an intervening partition barrier and a magnetic field generating yoke subassembly.

The Arc Discharge Chamber Structure

The elongated arc discharge chamber 1 is a self-standing and independent article of manufacture. Externally, the arc chamber has the shape of a rectangular prism, inside which a long uniform cavity volume is provided. The cavity volume configuration may have rounded contours, but has a uniform extruded shape.

Δ As seen in FIGS. 4 and 6, an arc discharge chamber 1 of substantially rectangular prism configuration and having an enclosed interior cavity volume 10 of elongated shape is presented. The arc chamber 1 is a closed box structure bounded by six discrete solid walls: A front wall 3, a back wall 8, two discrete laterally positioned and oppositely situated adjoining sidewalls 6a and 6b; and two discrete oppositely situated contiguous and abutting endwalls 12a and 12b (but not shown in the cross-sectional views of FIGS. 4 and 6).

A single open slot or exit aperture 5 (which can alternately appear as an array of open slots or channels) appears in the front wall 3 and is aligned with a pair of extraction electrodes 4a and 40a and 4b and 40b, which are individually placed apart a short distance from the exterior face of the front wall 3. The front wall may optionally comprise and be constructed of two separate halves.

Δ In addition, the back wall 8 of the arc chamber incorporates drilled passages 9 as shown in FIG. 4. Such passages serve as controlled orifices or portals which permit the at-will introduction of an ionizable gas or vapor to the cavity volume interior. The controlled orifices 9 provide a uniform distribution of the introduced gas or vapor within the cavity volume of the arc chamber.

Δ In this first embodiment, the arc chamber is made to fit snugly in a recess machined in the base flange or plate which is part of the vacuum wall. The box geometry of the chamber can be built of plates of refractory material (e.g. graphite, molybdenum, etc), which interlock as shown in FIGS. 5a and 6, and can be retained in place by spring clips. The contiguous and abutting endwalls of the chamber are closed plates which have holes to allow the anode rod(s) to pass there-through to external securing clamps.

The arc chamber, which will receive substantial power in operational use, is shaped externally to minimize surface contact, and will reach many hundred degreed C in operation. The vacuum wall must be cool, and it important to provide means to remove the heat, which are described below.

Δ The arc chamber cavity may typically measure 32 mm front wall-to-back wall; 32 mm sidewall-to-sidewall; and be any length in the range from about 80 mm to 2,000 mm or more in the X-axis direction—a sized dimension which corresponds directly to the breadth dimension of the extracted ion beam.

Within the limited cavity volume 10 of the arc discharge chamber 1 are two separate rod-shaped anodes 2a and 2b. Each rod-shaped anode 2a and 2b individually lies disposed adjacent to one laterally positioned adjoining sidewall 6a or 6b of the arc chamber 1; linearly extends along the X-axis over the full length dimension of the arc chamber 1; and is tangibly located within the peripheral spatial regions marginal spatial edges of the cavity volume 10 existing between the one of the adjoining sidewalls 6a and 6b and the back wall 8.

Δ Also disposed within the limited cavity volume 10 of the arc discharge chamber 1 is a single thermionic cathode 7. This cathode 7 is disposed upon the inner face surface of the endwall 12a. The cathode may in this $1^{st}$ embodiment instance be made from 0.090" diameter tungsten rod wound into a small loop; and can be installed through the end wall of the arc chamber.

* * *

The Primary Electron Trap Assembly

The second major requisite component of the invention is the primary electron trap assembly. In this $1^{st}$ embodiment, the trap assembly comprises two discrete structural entities: An intervening partition barrier; and a magnetic field generating yoke subassembly.

The Intervening Partition Barrier Structure

£ Because the arc discharge chamber must be operationally contained within a closed vacuum environment (maintained at a negative pressure ranging from about 1 Pa to about $10^4$ Pa) while the magnetic field generating yoke subassembly is routinely held and used in an ambient air environment—an intervening partition barrier 60 is preferably used as a structural component to orient and align the two structural entities.

However, in its broadest applications, the intervening partition barrier can serve up to three different functions and purposes. These are:

(i) As a structural divider which effectively separates a vacuum environment from an ambient air environment;

(ii) As a structural means for orienting and aligning the magnetic field generating yoke subassembly at a prechosen fixed distance and in an encompassing adjacent disposition around the arc discharge chamber;

(iii) As a structural entity incorporating passages for flowing cooling fluid such as water, capable of absorbing heat emanating from the operation of the arc discharge chamber, and preventing said heat from reaching the magnetic yoke and other sensitive components.

£ A preferred form of environmental-separation barrier plate 60 is illustrated in cross-sectional view by FIGS. 4 and 6 respectively; and its relationships to both the arc discharge chamber 1 and the adjacently located shaped yoke subassembly 100 are best shown by these illustrations.

As seen therein, the preformed barrier plate 60 serves as a structural divider and functions as a tangible environmental-separating partition, wherein the preformed barrier plate (a) is composed of solid matter which is materially adequate to maintain its obverse face surface 62 in a vacuum environment while concurrently maintaining its reverse face surface 66 in an ambient air environment;

(b) presents an obverse face surface 62 having a single spatial recess 64, which is contoured to receive and hold the exterior surfaces of the two laterally positioned and oppositely situated adjoining sidewalls 6a and 6b and the back wall 8 of the arc discharge chamber 1 then in a vacuum environment; and (c) concurrently presents an reverse face surface 66 having two pre-sized spatial recesses 68a and 68b, which are collectively contoured to receive and hold the magnetic field generating yoke subassembly in a properly aligned position and orientation within the vacuum environment.

£ The intervening partition barrier 60 is typically fabricated as a thick plate or bulwark made of aluminum or another high-thermal conductivity metal; into which two aligned spatial recesses 68a and 68b (seen best in FIG. 6) which appear on the air atmosphere side, and one aligned spatial recess 64 which appears on the vacuum side, are individually machined.

Via this structure, the partition barrier serves to orient, align and hold the shaped yoke subassembly; acts physically to separate the discrete yoke subassembly then found in the air environment at a fixed prechosen distance from the arc chamber then maintained in a vacuum environment; and concurrently also functions as a heat shield which effectively deflects the large quantities of heat emanating from the interior of the arc discharge chamber.

£ In addition to all of the foregoing, in this $1^{st}$ embodiment of the invention, the intervening partition barrier also provides the structural means for absorbing and removing heat radiated by the adjacently positioned arc discharge chamber, in order to prevent the heat from damaging components including seals and the magnetic electron trap yoke. The particular purpose here is heat absorption and not to cool the arc chamber. Thus, the area of contact between the arc chamber 1 and the partition barrier 60 is minimized by provision of limited areas of contact.

Notably for achieving this particular goal and purpose, multiple discrete water conduits and passageways 61 are provided within the material substance of the partition barrier 60. Details of the water conduits, cooling passages and fluid inter-connections are not shown in FIGS. 4 and 6, but are conventionally known as such and commonly used by practitioners in this field.

£ It will therefore be well recognized and appreciated that the placement of the intervening partition barrier 60 in this $1^{st}$ embodiment serves three different functions and critical purposes, which are:

(i) The structural partition barrier 60 serves to orient, align, and properly adjacently position the prism shaped arc discharge chamber at a fixed prechosen distance from the adjacently disposed magnetic field generating yoke subassembly;

(ii) The structural partition barrier 60 serves to hold and maintain the prism shaped arc discharge chamber in a vacuum environment while concurrently separating and keeping the magnetic field generating yoke subassembly in an ambient air environment;
and (iii) The structural partition barrier 60 functions as a tangible heat shield which guards and protects the magnetic field generating yoke subassembly (then disposed over its reverse face surface and multiple recesses) from the debilitating effects of exposure to extreme heat.

The Magnetic Field Generating Yoke Subassembly Structure

§ The magnetic field generating yoke subassembly 100 of the primary electron trap assembly is shown best in FIG. 5b. The yoke subassembly 100 is typically located in an air atmosphere, external to the vacuum environment; and is housed within the spatial recesses 68a and 68b on the reverse face of the partition barrier 60. This orientation and alignment allows the framework of the yoke subassembly adjacently and at a preset distance to partially surround the exterior faces and external perimeter of the arc discharge chamber 1, then contained in a vacuum environment.

§ As seen in FIGS. 4, 5b and 6 respectively, the yoke subassembly 100 adjacently surrounds three discrete exterior faces and discrete solid walls of the closed arc chamber at a preset fixed distance; and concurrently extends along and runs over the full length dimension of the arc chamber. The two discrete poles 115a and 115b will rest adjacent to the laterally positioned adjoining sidewalls 6a and 6b of the arc chamber are in fact inserted into in the recessed housings 68a and 68b on the reverse side of the barrier plate 60, which in this instance, is part of the vacuum enclosure wall. Similarly, the third elongated pole 116 is inserted into spatial recess 69 on the reverse face of the barrier plate 60.

In general, the format and construction of the magnetic field generating yoke subassembly can comprise either wound wire coils or employ permanent magnets as the magnetic pole constructs. However, in this $1^{st}$ functional embodiment illustrated by FIG. 5b, the yoke subassembly 100 comprises a substantially U-shaped supporting framework 110 formed of ferromagnetic material—upon which are disposed in sequential series three elongated ferromagnetic poles 102, 115a and 115b of alternating polarity.

§ The structure of the single preformed ferromagnetic pole 116 is shown in FIG. 5b. It is in essence an elongated solid shaft, dowel, or bar formed of a ferromagnetic material or metal alloy; is a preformed elongated article which does not include or present any wire winding or coil as such; and is sized to be at least co-extensive in measurable distance with the linear length dimension of the arc discharge chamber.

Note that only a single ferromagnetic pole 116 appears in the U-shaped yoked subassembly 100; and in this instance, the pole 116 will always lie disposed upon the middle segment 111 of the framework of yoke subassembly 100. Consequently, when the U-shaped yoked subassembly 100 is fitted to the reverse face surface of the environmental-separating barrier plate 60, the pole construct 116 will come to lie within the spatial recess 64 and be positioned adjacent to the exterior face of the back wall 8 in the arc chamber 1.

§ In comparison, each of the two preformed ferromagnetic poles 115*a* and 115*b* are made of ferromagnetic material; and a single continuous wire winding or discrete obround coil 105*a*, and 105*b* is transversely wound as a spiral loop around the axial length of pole 115*a* and *b* respectively, to enable magnetization of the poles and thereby assembly 100.

Each obround coil 105*a*,105*b* is typically made from a continuous wire length of electrically conductive material; is a transversely disposed wire winding formed as a substantially racetrack-shaped whorl; and appears as a closed spiral loop or obround coil which comprises two parallel straight length sections, as well as two curved ends each bending through 180 degrees. Together, the supporting shelf and the transversely placed wire winding coil form the operative ferromagnetic pole construct as a whole.

Also, each obround coil 105*a*, 105*b* may each be wound using enameled copper wire and will typically provide about 300 to 800 Ampere turns when excited. Each coil is energized by a constant-current programmable power supply. Thus, if each obround coil contains about 50 turns, it may be operated at between 0 and 20 amperes.

§ Each discrete pole construct 115*a* and 115*b* is individually mounted upon one upright arm section 103 of the U-shaped yoke framework 110; and together will appear as an oppositely-oriented pair of spaced-apart ferromagnetic poles disposed upon the structural arms of the three-sided yoke framework 110. The two discrete ferromagnetic pole constructs 115*a* and 115*b* are thus employed in combination as a tandem pairing; and each ferromagnetic pole construct 115 of the pair will come to be oriented towards and lie in parallel with the length dimension and X-axis of the arc discharge chamber 1 when the yoke framework 110 is adjacently fitted around the exterior faces and walls of the arc chamber 1.

§ Operationally, the two obround coils 105*a* and 105*b* mounted upon the poles 115*a* and 115*b* will generate individual 'North' polarities on either side of the yoke framework 110; while the single magnetic pole 102 mounted upon the base of the yoke framework 110 will generate a 'South' polarity at the rear; or vice versa. The specific field direction does not matter provided the two poles 115*a* and 115*b* present the same polarity.

B. Operating Features of the $1^{st}$ Embodiment

Producing a Plasma

Figure 13A:
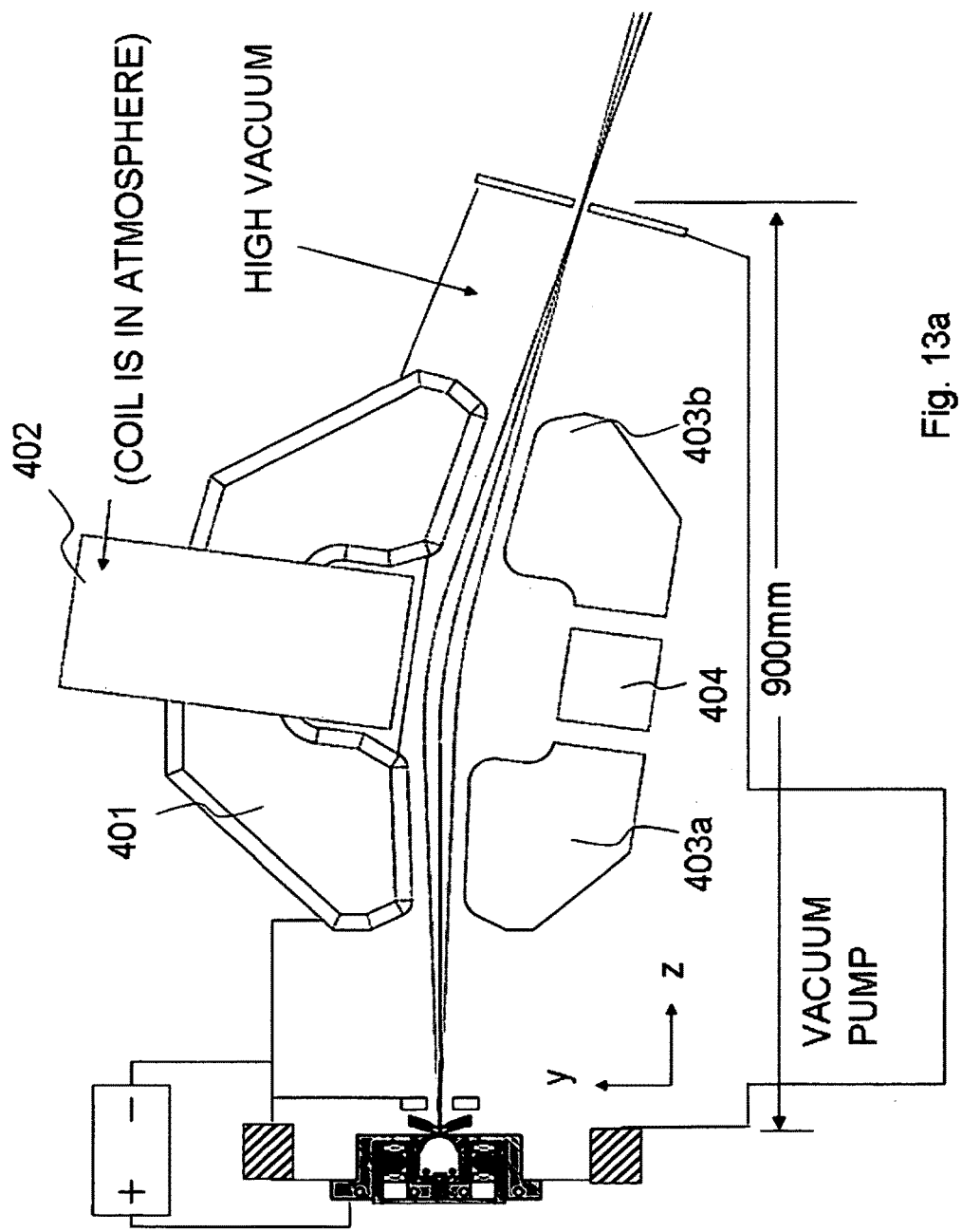
FIGS. 13a and 13b show the use of the improved ion beam source of this invention in combination with an analyzer magnet as an operative system wherein no magnetic fields parallel to the X-axis exist.

A high vacuum environment is established for the arc discharge chamber by means of pumps, as illustrated in FIG. 13*a*.

The cathode filament 7 is heated until it emits electrons by passing up to 200 amps through it from a 7.5V 200 A power supply. The negative side of the cathode filament is connected to the negative side of the arc power supply, and is also connected to the solid walls of the arc chamber; and a voltage of 40 to 120V is applied between the anodes and the cathode filament.

The quadrupole magnetic field is generated by the yoke subassembly and is operationally installed within the cavity volume of the arc chamber by passing ~12 A through the two obround ferromagnetic coils 105*a* and 105*b* mounted upon the side poles of the U-shaped yoke subassembly.

Gas is then introduced into the cavity volume of the arc discharge chamber to raise the internal cavity pressure to ~1 Pa, wherein the primary electrons emitted by the cathode filament ionize the gas and create a plasma in-situ.

The Extraction Electrodes

Potentials

The entire ion source (i.e., the arc discharge chamber and the primary electron trap assembly) is electrically biased at a positive value with respect to ground by a potential [usually in the range 1 to 100 kV] which defines the beam energy.

Thus, in this $1^{st}$ embodiment, the extraction electrodes 40*a* and 40*b* are connected to ground. Electrodes 4*a* and 4*b*, which control the initial electric field by means of the potential applied to them and their spacing from the ion source, are biased negative with respect to ground by an accel/decel voltage of −1 to −5 kV. As shown in FIG. 4, the spacing is optimum for about 5 keV final beam energy. The positive ions flowing from the plasma are extracted and pass through the exit aperture 5 and the gaps between the electrodes, and these form a streaming ion beam with a divergence of about +/−2 degrees.

Adjustments (Mass, Energy, Current)

The Child-Langmuir law is used to estimate the electrode spacing required to generate a given current. The electrode gap g must always be significantly larger than the electrode aperture width, or else geometric effects mean that the electric field at the center of the aperture is drastically weaker than the equation implicitly assumes. One strong reason for using a narrow slot extraction rather than a round hole is that the electrode gap may be made small while the long slot allows for a large emitting area.

With the electrode spacing set at a suitable gap for the desired current density, a plasma is established; and when the desired extraction voltage applied, a beam is extracted. The beam's divergence may be estimated by several methods—for example the ion current transmitted through a slot narrower than the beam will be maximized at or near the conditions giving the minimum beam divergence. The Decel voltage can be adjusted to maximize this current, within limits.

If a wide range of operating conditions is expected, the triode extraction arrangement can be replaced with a tetrode (4-electrode) arrangement. The voltage across the first gap may now be adjusted freely to minimize the beam divergence; but the total voltage still defines the energy. The accel/decel voltage applied to the third electrode can also be adjusted in conjunction with the accel voltage to give the best transmission of the beam through the exit aperture.

The Installed Quadrupole Magnetic Field

It is important to understand properly the mode and manner of how the quadrupole magnetic field installed within the cavity volume of the arc chamber appears and functions for this 1$^{st}$ embodiment of the invention. For this purpose, FIGS. 10, 11 and 12 respectively are provided.

As seen therein, FIG. 10 is a cross-sectional view of the 1$^{st}$ embodiment which shows the lines of magnetic flux B constituting the installed quadrupole magnetic field as the flux fines are generated and then flow into and through the internal cavity volume of the arc discharge chamber. The field lines can be seen to pass from N to S pole; while toward the exit slit, the field lines curve in the opposite . The field null occurs in the zone where no field lines pass. direction The cathode 7 is mounted so as to encompass or intersect the null field line.

FIG. 11 is a cross-sectional view of the 1$^{st}$ embodiment which shows the magnetic contour lines with the field strength values measured in Gauss The field null point is labeled "0"; and if the cathode were shown in FIG. 11, it would be seen to encircle or intersect the axis through this point. The field is seen to rise fairly uniformly in three directions; while in the direction of the exit aperture, the field only rises to between 20 and 40 Gauss before leveling off.

FIG. 12 is a cross-sectional view of the 1$^{st}$ embodiment which shows the spatial zone of primary electron confinement created by the trap assembly within the internal cavity volume of the arc discharge chamber. By comparing the shape of this spatial zone with the field lines of FIG. 10, it can be seen that the electron confinement is caused by the inability of the primary electrons significantly to cross the field lines. It can also be seen in FIG. 12 that four limited areas that this zone appears to reach to the walls. The electrostatic potential blocks the electrons from reaching the walls at these points—but only in the final fraction of a mm, which is not discernible within the figure.

V. A Second Preferred Embodiment

In this second preferred embodiment, a number of dominant changes exist and pertain which markedly separate and distinguish this second embodiment from the 1$^{st}$ embodiment described above.

First, all of the requisite components and operative parts of the invention—i.e., both the prism shaped arc discharge chamber as well as most of the primary electron trap assembly—are situated in a negative pressure domain and lie completely contained within a high vacuum habitat. This circumstance is markedly different from the 1$^{st}$ embodiment described above in that the vacuum wall comprises a part of the magnet yoke, and all the active faces of the magnet yoke of the primary electron trap are in vacuum.

Second, the magnetic field generating yoke subassembly of the primary electron trap assembly is constructed using two permanent magnet pole constructs disposed upon the upright arm sections of the framework. However, once again there are three poles (215a, 215b, and 216 respectively in FIG. 7a) presented toward the arc chamber of alternating polarity which lie spaced-apart in sequential series upon an open, substantially square-shaped, supporting framework.

Figure 7A:
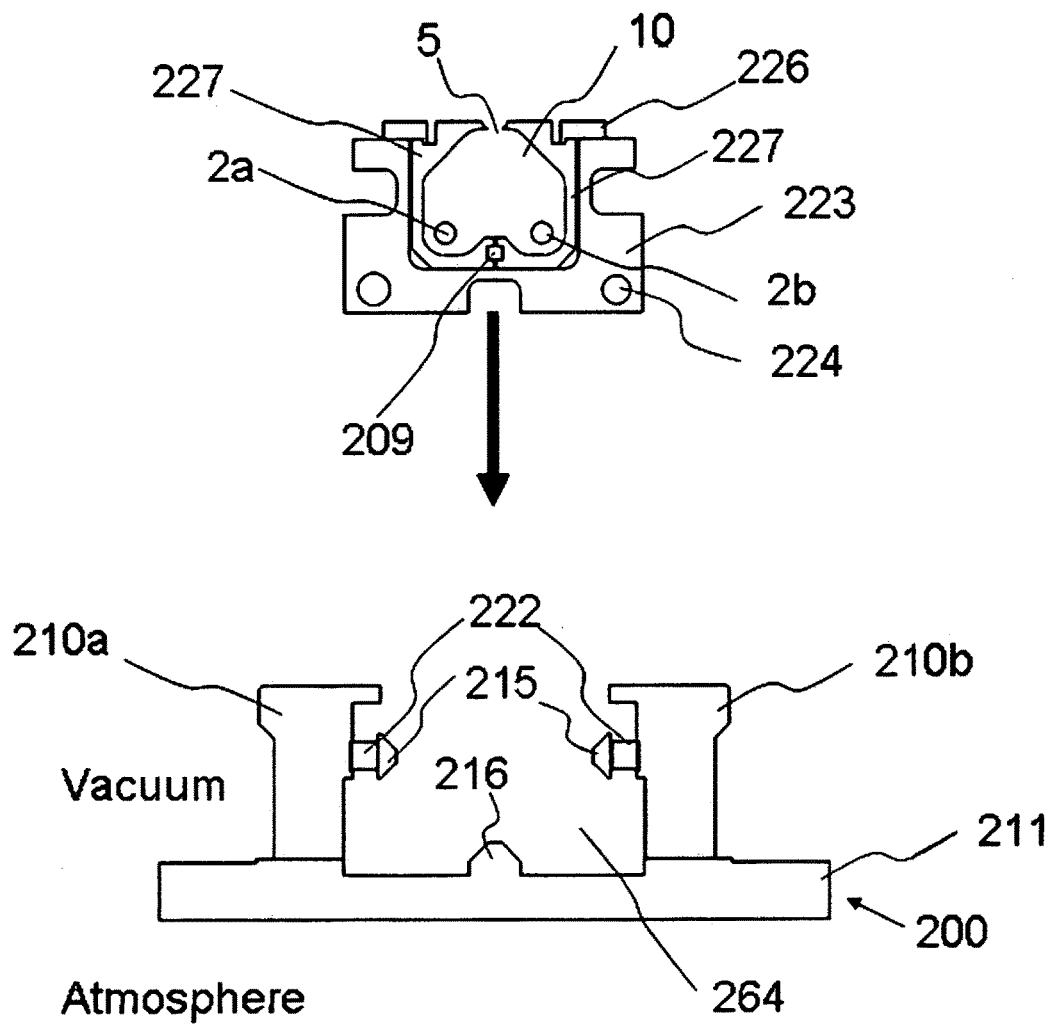
FIG. 7a is a partially exploded section view of a 2$^{nd}$ preferred embodiment of the improved ion source.

Third, the water-cooled partition barrier which exists between the arc chamber and the magnet yoke is a simple, smaller, U-shaped trough 223, incorporating water channels 224 as illustrated in FIG. 7a. The arc chamber comprises two identical halves 227 made of refractory material which are retained within the trough.

Fourth, FIG. 8b illustrates a variant in which the arc chamber itself is cooled, and can be made in two halves 250a and 250b which are then held together.

Fifth, the magnetic sidewalls 221 of the open yoke subassembly also function as structural components clamping the cooled trough 223 or cooled arc chamber 250a and 250b in place; and further provide the anchorage point for insulators 290 which will hold the split extraction electrodes 4a and 4b in place, as shown in FIGS. 8a and 8b.

Accordingly, although the invention fundamentally remains comprised of the same requisite structural components—the arc discharge chamber and the primary electron trap assembly—there are a number of meaningful alternations and distinct modifications in this second preferred embodiment when compared to the 1$^{st}$ embodiment described above.

Noted Differences in the Primary Electron Trap Assembly then Located Entirely within the Vacuum Habitat

1. Differences in the Intervening Partition Barrier

In the 2$^{nd}$ embodiment shown by FIG. 7a, the intervening partition barrier appears as a one-piece housing 223 made of aluminum (or another non-magnetic metal or alloy). The partition barrier housing 223 contains multiple closed passageways and conduits 224 for cold water to pass therethrough; is shaped over its obverse face surface for positioning adjacent to and around the discrete adjoining sidewalls and back wall of the arc discharge chamber 1; and is contoured on its reverse face surface for precise orientation, alignment and fitting with an open, substantially square-shaped, yoke subassembly 200 comprising three poles 215a, 215b and 216 and two linear arrays of permanent magnets 222 disposed on three internal faces over its open framework.

In this 2$^{nd}$ preferred embodiment, the intervening barrier plate housing serves two different functions: (a) It adjacently encompasses and surrounds three discrete solid walls of the arc discharge chamber; and (b) It acts as a heat barrier and thermal shield which guards and protects the permanent magnet field generating yoke subassembly from the extreme heat released by the arc chamber.

2. Differences in the Open Yoke Subassembly

Figure 7B:
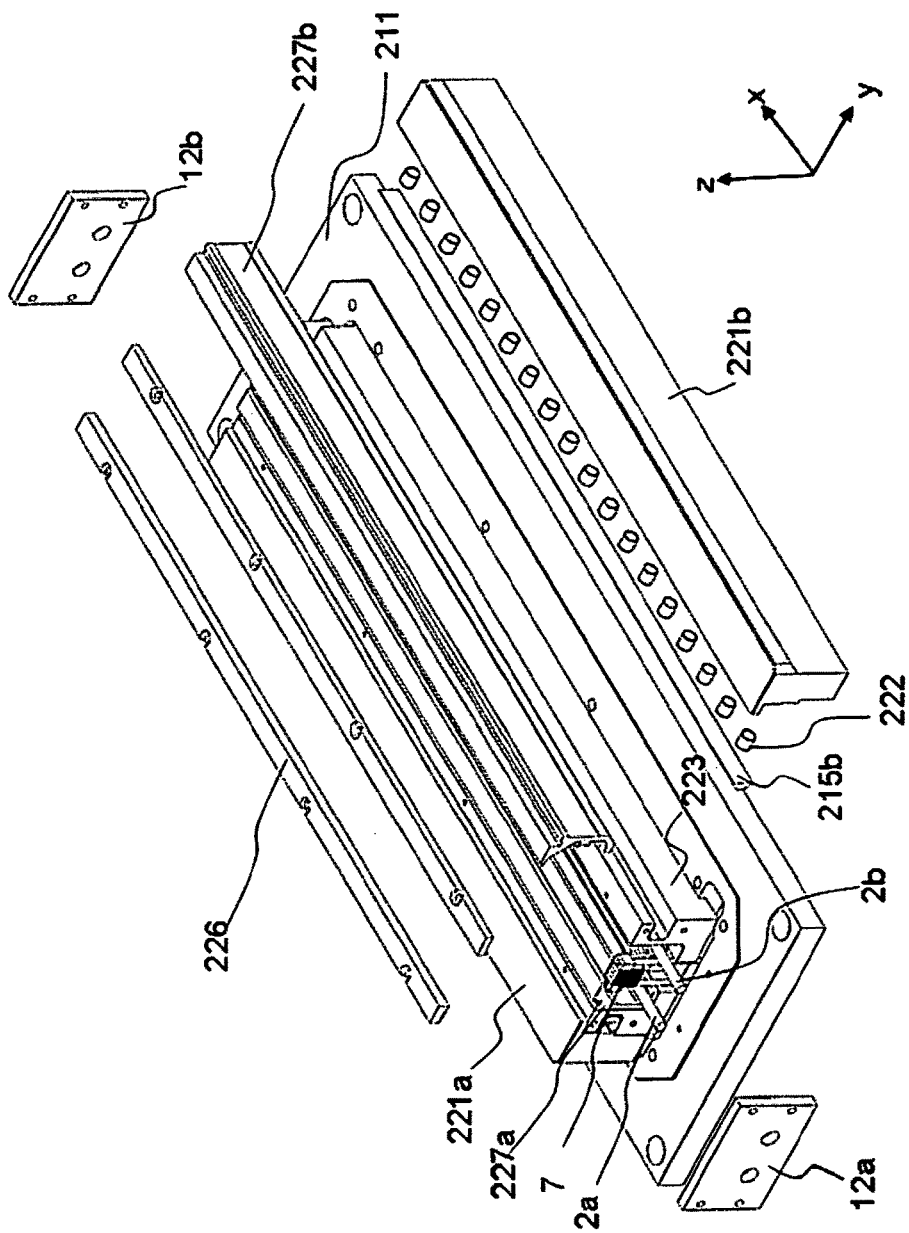

The structure of the yoke subassembly 200 is markedly different in this 2$^{nd}$ preferred embodiment, as shown bit FIGS. 7a and 7b. Three elongated poles are again provided, extending the length of the arc chamber in the x-direction, mounted on internal faces. Two linear arrays of permanent magnets 225a, 225b, lie arranged in sequential series and are individually disposed upon the two upright arm sections 210a, 210b of the substantially square-shaped, open framework 200.

○ Most notably in this 2$^{nd}$ embodiment, the shaped yoke subassembly 200 presents a ferromagnetic base plate 211 which simultaneously combines the roles of a durable vacuum wall and the bottom portion of the square-shaped open yoke frame. A suitable material for this ferromagnetic base plate 211 is Type 430 stainless steel—which is magnetic, resistant to corrosion, and suitable for use in vacuum environments.

The two upright arm sections 210a, 210b of the yoke framework 200 may also be made of type 430 stainless steel, or more economically is fabricated from plated mild steel. These upright arm sections are structurally joined with screws at a 90 degree angle to the planar base plate 211; and together collectively form the open square-shaped yoke frame. These upright arm sections further serve as retaining clamps to hold the cooled barrier trough in place.

○ Upon each upright arm section 210a, 210b—in place of the wire winding obround coils shown in the $1^{st}$ embodiment—is a discrete permanent magnet construct comprising a ferromagnetic pole 225 and a plurality of permanent magnets 222 in a linear array; which are oppositely situated upon each arm sector and act in tandem as aligned ferromagnetic poles. A third ferromagnetic pole 216 is typically attached to the ferromagnetic base plate 220, or else is incorporated into the base by machining. Although it could have additional permanent magnets incorporated in its structure, it can be sufficiently energized without additional magnets if magnets 222a, 222b have been appropriately sized This set of three magnetized poles (which have alternating polarity) are spaced-apart from each other on three internal faces of the open yoke framework and together constitute the open yoke subassembly 200; and the resulting yoke subassembly can generate and install on-demand a discernible quadrupole magnetic field within the limited confines of the internal cavity volume in the arc chamber. The installed quadrupole magnetic field will have the same distorted quadrupole field shape as described above for the $1^{st}$ embodiment; but its magnetic strength cannot be adjusted in real time. Nevertheless, the generated magnetic strength can be adjusted in-situ by adding or subtracting permanent magnets 222a and 222b (in equal numbers) from the linear arrays.

Structural Modifications for the $2^{nd}$ Embodiment of the Arc Discharge Chamber A Hot Arc Chamber As illustrated in FIG. 7b for this $2^{nd}$ preferred embodiment, the arc chamber (formed of refractory material such as graphite) is desirably fabricated by the juncture of two symmetrical halves 227; and is carefully dimensioned to fit with the obverse face of the of the barrier trough housing in a central well of the heat shield. The arc chamber Is secured and retained by two screwed-in retainers 226 which hold each arc chamber half 227 in place against a stable face surface of the heat shield structurally represented and provided by the barrier plate housing. The exit aperture 5 in the front wall of the arc chamber is thus bounded by two separate pieces of refractory conductive material; and this method of arc chamber construction ensures stability of the exit aperture over the greatly increased length dimension of the arc chamber without relying on a far-weaker structure which links the two halves only at their ends.

A Cold Arc Chamber Option

FIG. 8b shows an alternative format for a cold arc chamber. This alternative format replaces the heat shield/barrier plate housing for the refractory arc chamber above with a simpler 2-piece water-cooled arc chamber having the same (or a substantially similar) configuration both externally and internally; but presents the plasma produced in-situ with cool chamber walls, even when operating at several kW of power.

In this alternative format, the exit aperture 5 of the prismatic-shaped arc chamber is again formed by the juncture of the two separate halves of the arc chamber 250a and 250b, as described above. Separate discrete end plates 12a and 12b are attached to close the ends of the arc chamber; and as before, these two chamber half-sections each contain holes for the anodes and possibly for the cathode to be externally secured.

Structural Simplifications and Effective Cooling

A partially exploded view of these modifications is illustrated by FIGS. 7b (hot arc chamber) and in 8b (cold arc chamber). As seen therein, water cooling conduits and passageways acts upon the magnetic base plate of the open yoke subassembly and markedly adds to the heat shield effect provided by the partition barrier housing. The magnetic base portion 211 and the heat shield/barrier plate housing 223 (or cooled arc chamber 250) have a large area of direct contact—and in this shared area, o-ring seals are placed; and recesses in both parts allow the passage of water into intimate contact with both parts in this area (as seen in FIG. 8b).

Thus, by these means utilizing a minimum number of components, the practitioner can provide a strong and durable vacuum wall; a cooled barrier housing for the arc chamber; a structural mounting for all the other desirable features via feed-throughs for electrical connections, water cooling fittings, and gas fittings; an aligned foundation for yoke subassembly able to generate a quadrupole magnetic field within the cavity volume of the arc chamber; and a firm structural support for properly mounting the extraction electrodes to lie over the exit aperture of the arc chamber (as shown in more detail by FIGS. 8a and 8b).

VI. A Third Alternative Embodiment

In this third alternative embodiment, several unique structural differences appear which substantively distinguish this format from both of the $1^{st}$ and $2^{nd}$ embodiments described above. Thus, although the invention essentially remains comprised of the same two structural components—the arc discharge chamber and the primary electron trap assembly—there are nevertheless several meaningful changes and distinct structural modifications in this third alternative embodiment.

In particular, the third alternative embodiment presents the following changes:

◇ The entirety of the improved ion source—including both the arc discharge chamber and the primary electron trap assembly—are located solely within a vacuum environment, ◇ The intervening partition barrier contains recesses for the location of two separate, disconnected, magnetic yokes. Thus, the magnetic field generating yoke subassemblies are located close to the arc chamber, but separated from it by a wall of high conductivity metal such as aluminum which again contains passages for cooling fluid.

A Split Yoke Framework

§ In many expected use circumstances, it is very desirable to generate a discernible quadrupole magnetic field whose installed location and boundaries within the cavity volume of the arc chamber can be rotated 45 degrees from those field orientations and alignment described by the $1^{st}$ and $2^{nd}$ embodiments previously herein. Attention is again directly to FIGS. 10, 11 and 12 respectively—which show the magnetic flux lines of the installed quadrupole magnetic field for the 1st embodiment of the invention.

Figure 9:
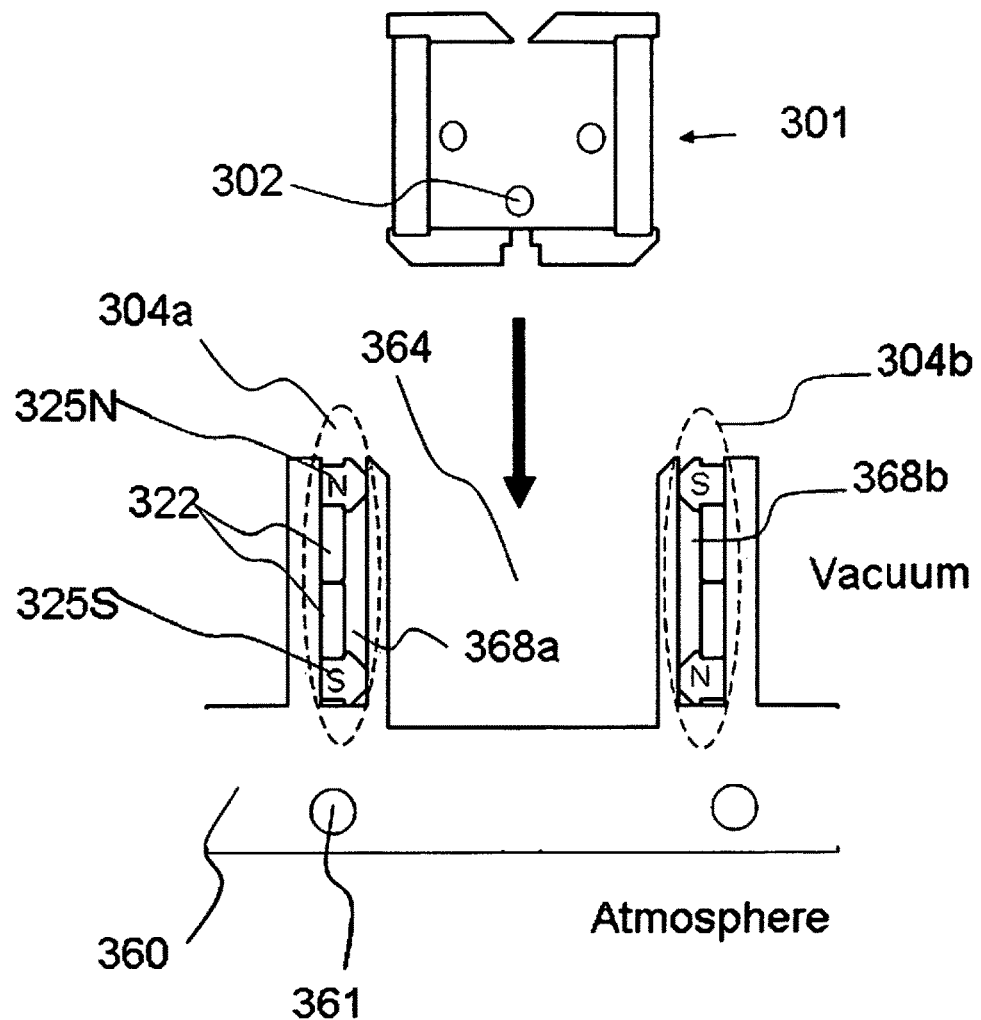
FIG. 9 is a partially exploded cross-sectional view of a 3rd alternative embodiment of the ion source.

§ Thus, in order to achieve a desired 45 degree rotation change for the installed quadrupole magnetic field internally within the cavity volume of the arc chamber, two similarly-constructed split yoke frame sections are used together in combination as the magnetic field generating yoke subassembly—wherein each yoke frame section is individually positioned in an anti-symmetric pattern directly adjacent to the exterior faces and sold walls of the arc chamber, as shown in FIG. 9.

The term 'anti-symmetric' is used here appropriately because the term 'symmetry' would imply that both yoke sections were installed with the same polarity; whereas, it is necessary to reverse (alternate) the polarity of one yoke frame section in the subassembly.

Accordingly, as seen in FIG. 9, a partition barrier structure 360 is made from aluminum alloy or other high conductivity metal, and separates atmosphere from vacuum. It comprises coolant passages 361, and three discrete cavity spaces 368a, 368b and 364 on the vacuum side.

§ Fitted into the partition barrier 360 are two discrete split-yoke frame sections 304a and 304b. These two frame sections have been fabricated separately; and when installed in (non-magnetic) partition barrier 360 will collectively constitute and result in the complete open yoke subassembly 300. Each split-yoke section 304a and 304b comprises a pair of extended ferromagnetic poles 325N and 325S, connected to each other by a linear array of permanent magnets.

§ As illustrated by FIG. 9, one of the magnetized poles 325N in one magnetic pole construct 304a is purposefully placed on the interior face of the recess 368a, and is individually located to become adjacently aligned with and fitted close to the front wall of the arc chamber 301; while pole 325S is individually located to become adjacently aligned with and fitted close to the back wall of the arc chamber 301. The other oppositely located magnetic pole construct 304b is reversed, and pole 325N is aligned and fitted close to the back wall of the arc chamber 1. The polarity is reversed appropriately, as shown in FIG. 9.

Thus, when placed properly within the dividing partition 360, the magnetic pole constructs 304a and 304b will encompass recess 364, the prepared space into which arc chamber 301 is ultimately positioned; and the serial arrayed sequence of four discrete poles encircling the arc chamber 301 runs 'N-S-N-S" in alternating polarity; and a discernible quadrupole magnetic field is generated and installed within the internal cavity volume 310 of the arc chamber 301, the orientation of the installed quadrupole magnetic field then being rotated about 45 degrees when compared with those magnetic field orientations provided by the $1^{st}$ and $2^{nd}$ embodiments.

Structural Alternations in the Arc Discharge Chamber

§ In this third alternative embodiment, it is also necessary to reposition the disposition of the anode rod (or multiple anode rods), since these anodes must have lines of flux passing between them and the central null position in the installed quadrupole magnetic field.

Thus, as shown in FIG. 9, a centrally placed anode rod 302 (which is now located closer to the solid back wall of the arc chamber) serves as a structurally sufficient relocation. If desired, additional anode rods can also be located approximately half way up the each of the oppositely situated adjoining sidewalls of the arc chamber. Many other similar anode rod re-arrangements have been evaluated and can be devised which would operative properly and be functional for use.

§ Although shown as a rectangular prism-shaped construction in FIG. 9, the arc chamber overall internal configuration could well be cylindrical. Such a cylindrical-shaped arc chamber would bring those portions of the chamber's walls closer to the center; which in turn, would reduce the cavity volume in which ionization is occurring.

§ However, the rectangular prism shape shown by FIG. 9 permits and in fact encourages a much simpler model for the $3^{rd}$ alternative embodiment. In this instance therefore, a supporting flange 360 for the two split-yoke sections 304a and 304b (which with base 360 constitute the complete yoke subassembly 300) is desirably present. The supporting flange 360 is a plate or flat collar structure formed of resilient material; and will include multiple water cooling conduits and passages 311.

Specific Applications for the Third Alternative Embodiment

In this third alternative embodiment, the ions exiting the open aperture of the arc chamber are directionally traveling normal to quadrupole magnetic field lines; and the installed magnetic field would be effective to block fast electrons from leaving the arc chamber. For this reason, therefore, this alternative embodiment is of major value as an auxiliary source of un-accelerated cool plasma—e.g., as a plasma bridge for controlling surface charging and the potentials in the environment during ion beam processing with another source.

VII. Operational Variables, Parameters & Other Considerations for the Invention as a Whole Temperature Variation Considerations The power delivered into the arc chamber by the heat to the cathode, plus the heat to the plasma, may be several kilowatts. Arc currents may be 50 A per meter of arc chamber length, at 40V to 120V; so depending upon the dimensional size of the arc chamber box, a considerable amount of power is deposited.

It is desirable when certain ion species are being generated that the arc chamber's back wall and two adjoining sidewalls run hot. For example, temperatures greater than 400° C. are desirable for the reliable use of arsenic or phosphorus vapors, in order to prevent their condensation. The arc chamber walls may be made of graphite, tungsten, or molybdenum or other refractory metal, and may reach 1000° C. This heat must be removed without overheating the wire winding coils or permanent magnets of the open yoke subassembly; so either a re-entrant structural base or an interposed trough-shaped heat shield of aluminum containing internal water passages is used to remove the heat and separate the arc chamber box from the yoked magnetic pole arrangement.

For other species (e.g. oxygen and argon) it may be desirable to have cold arc chamber walls. It is also possible to make the arc chamber froth aluminum or other metals, incorporating water passages in the chamber to keep it cool. In each instance, a water-cooled metal wall is Interposed between the arc discharge and the magnetic yoke, to keep the latter cool.

The Internal Configuration of the Arc Discharge Chamber

The internal configuration of the arc chamber box is often rectangular, or cylindrical, or a hybrid shape which is partly cylindrical, but has recesses surrounding the anode rods. For example, the configuration shown by FIG. 4 has an internal shape comprising a half-cylinder in the upper half of the figure, and a half-square in the lower half, and the anode rods occupy spaces near the two corners in this lower half of the figure.

The factors affecting this shape are: minimize the cross-sectional area, allow the anode rods to be shielded by the flux lines from the region of near-zero field, and allow the flux lines to be almost parallel to the wall where their curvature makes this possible, as this enhances the ExB drift velocity of the electrons and promotes uniform ionization, as discussed above. Other minor variations in shape for convenience, reinforcement, dimensional stability, or ease of manufacture, are envisaged.

Control of the Ion Beam Output

Electron energies of up to 120 eV may be needed to efficiently produce ions of some species; in other cases lower energies are preferred. The anode voltage controls this energy.

The fraction of the generated ions which are successfully extracted is largely determined by the ratio of the width of the exit slot to the circumference of the arc chamber, which is about 3%. When ions hit the walls of the arc chamber, they have a high probability of being neutralized; and many species will then vaporize and return to the ionizing zone. Thus a high percentage of the total gas supplied may end up as ionized beam, although each ion may have been through this cycle thirty or more times.

For certain ion species, e.g. boron ions from $BF_3$, the source gas is a fluoride molecule, and in these cases the use of fluoride gases is may improve output by etching the deposited wasted ions from the walls and returning them to the discharge. Adjusting the gas flow changes the fractions of different ion species.

The rate of generation of ions is determined by the current of primary electrons, the flow rate of gas introduced into the arc chamber, the arc voltage (which determines the primary electron energy), and in some instances by other factors such as the maximum magnetic field strength and the wall temperature. The ion source output is regulated by comparing a desired parameter to a reference signal, to generate an error signal which is used to adjust the power to the thermionic cathode in a closed control loop.

Initially this control loop may adjust the cathode power to deliver a specific electron current, but it is desirable once a beam is being delivered to regulate the total ion beam current. Once the control loop is maintaining a constant ion beam current, the voltages on the electrodes may be readily adjusted to minimize beam divergence, and the gas flow may be adjusted, for example to minimize pressure in the vacuum system while maintaining stable beam production, or to optimize yield of a specific ion species in the ion beam.

Ion Beam Formation

The extraction of ion species from the ion source to form a beam is conventional, and typically uses an acceleration/deceleration electrode structure to prevent back-streaming of electrons. The ion source is biased positively from ground, at, for example, 20,000V to produce a 20 keV ion beam.

The improved ion source assembly is able to produce beams of hundreds of milli-amperes of ions at the energy determined by the potential applied to the arc chamber with respect to ground. The ion beam is a fairly uniform ribbon-shaped stream whose breadth size (and Y-axis dimension of the chamber) is determined and limited only by the arbitrarily chosen length dimension of the arc discharge chamber; and frequently may be 1-2 meters or more in size. The beam width (and the X-axis dimension of the exit slot) is much narrower, typically only 2-3 millimeters and diverging at +/−2 degrees or so, assuming that the optics of the extraction electrodes are well designed.

The Introduction of a Gaseous Substance

The pre-chosen gaseous substance is desirably introduced through use of several uniformly distributed drilled inlet orifices into the internal cavity volume of the arc discharge chamber. These inlet drillings are openings designed and placed to avoid large pressure variations in the central ionization portion of the spatial cavity.

Gas flow is desirably measured and controlled by a commercially available thermal mass flow controller, at a flow rate which typically lies in the range of 1 sccm per 20 to 100 mm of inlet orifice length. Fine-tuning of the distribution of the gas flow can be used to correct non-uniformities in the beam current profile.

Variances of Cathode Material

The cathode material is most preferably tungsten or a tungsten alloy. Because of the gases used in the internal spatial volume of the arc chamber, other chemical compositions and materials have a relatively short use life. Directly or indirectly heated cathodes may be used, as is today well-known in the technical field.

Preferred Potentials

The entire ion source is preferably biased at a positive potential which defines the final ion energy, so that positive ions will be accelerated from the slot in the chamber toward ground potential.

For most uses a triode electrode arrangement comprising the arc chamber exit slot plus two additional electrodes (each comprising two connected halves) is used, including a negatively biased electrode which is required to suppress back-streaming electrons, as is well known in this art and shown in FIG. 2. Addition of an additional electrode between the arc chamber and the negatively biased electrode allows a wider range of control without using dynamically movable electrodes. The use of moving electrodes is common, but the required precision and thermal expansion problems would be formidable for such large systems as we are concerned with.

VIII. A Summary of the Distinctive Features and Traits Presented by the $1^{st}$, $2^{nd}$ & $3^{rd}$ Embodiments Collectively Most emphatically, the improved ion source provides the following characteristics and properties in every instance and embodiment:

1. There can be no magnetic field component existing along the direction or axis of the major linear length dimension for the arc discharge chamber. Instead, it is essential that any generated magnetic or electric field must lie coplanar with a plane or axis normal (i.e., existing perpendicularly or at a 90 degree angle) to the major linear length dimension (and X-axis) of the arc discharge chamber. There can be no exception to this critical requirement beyond small accidental variations and termination details at the ends; it is an inviolate rule and absolute condition for every embodiment of the improved ion source without regard to any other features.

2. The installed magnetic field cross section must have a multipole profile, with a line of zero field located a short distance behind the exit aperture of the arc chamber. The field strength should increase more-or-less linearly with distance from this null field axis, but it is desirable that it stays relatively weak in the direction of the extracted beam. The best field profile satisfying this requirement is a quadrupole field with a small admixture of a sextupole profile, which can be generated with just three poles. A quadrupole field requires that opposite poles be of the same type (e.g. north opposite north).

3. A multi-sided, open shaped yoke subassembly is employed to satisfy the critical requirement of a primary electron trap assembly. Structurally for this purpose, at least three discrete ferromagnetic poles are individually positioned upon and spaced apart within an open yoke framework—a configured structural arrangement which is to be fitted to and adjacently surround the exterior faces surfaces and measurable perimeter of the solid back wall and the oppositely-situated adjoining sidewalls of the arc discharge chamber. The open shaped yoke subassembly does not intrude into the space on the front side of the arc chamber where the beam is extracted. The magnetic poles must lie parallel with the X-axis, and the length dimension of the arc chamber.

4. The anode or anodes are rods aligned with the X-axis, and extend over the entire length dimension of the arc chamber. The anodes are located where magnetic flux lines curve around them and separate them from the region where the magnetic field is effectively null in strength.

5. To enhance trapping of primary electrons from the cathode while using relatively small and thus inexpensive magnetic field strengths, the electron trap assembly and the anodes are so oriented that the four magnetic cusps intersect arc chamber surfaces, which are at or slightly negative with respect to the thermionic cathode.

IX. A Representative & Exemplary Ion Implanter System

A representative and exemplary ion implanter system which uses the improved ion source of the present invention and which is closely coupled to a new analyzing magnet suitable for processing Generation 8 flat panel displays is described in detail below.

¶ Flat panel displays for a number of different applications incorporate transistors in a film of low-temperature polysilicon deposited on a glass substrate to control the emission or transmission of light in each pixel. The substrates can be very large. The so-called Generation 8 displays require ion implantation into discrete panels which are about 2.2 m×2.5 m in size. To dope these transistors in such panels, ion beams of phosphorus and boron particles, having ion energies in the range of 15 to 80 keV, at high and low currents are required. Expectations for beam current are 1 to 4 mA per cm of beam length; and higher current values would raise productivity. Also, the ion beam must be mass-analyzed to remove unwanted contaminants, such as hydrogen from the phosphine, and fluorine/fluorides from the boron.

¶ Notably, it is very difficult to mass-analyze broad breadth ribbon beams, —because the conventional sector magnet approach taught in text-books implicitly assumes that the gap space distance between the magnetic poles is much smaller in measurable size than the other dimensions. However, if the beam breadth dimension is now >2.2 meters in size, the pole gap distance must be at least as large, and the other magnet dimensions become impossibly large in size.

It is conventionally recognized that a number of improvements have been made, including those of Aoki, White, and Glavish. But, although all these improvements have made analysis of beams of considerable breadth possible, they all still conform to and obey the basic scaling laws that presume all of the following:

(a) The number of ampere turns to produce a given field is proportional to the pole gap;

(b) The weight of the magnet is roughly proportional to the square of the pole gap; and (c) The extent of unwanted fringe fields and aberrations grows as the pole gap gets larger.

However, such additional magnetic analysis of an arbitrarily long dimensioned, large breadth beam by a conventional dipole magnet is very difficult, and the required equipment is massively large and expensive to obtain. Instead, an operative and practical system of ion purification must employ a uniquely structured magnetic analyzer device in which the generated magnetic fields are entirely confined and limited to the y-z plane alone.

¶ A novel and unforeseen system combining the present improved ion source assembly with an adjacently located magnetic analyzer apparatus able to generate magnetic fields limited to the y-z plane alone and in which all magnetic and electric fields are substantially coplanar in a single plane (including the input and output directions of travel of the ion beam) is an immediate extension and direct elaboration of the instant invention as a whole. Accordingly, such a system and method of ion beam purification is deemed to be an integral part of and is properly within the true scope of the presently defined invention.

Such a uniquely structured magnetic analyzer apparatus is described in detail in a co-pending patent filing; and is shown by FIG. 13a as one of the system components.

¶ As shown, FIG. 13a illustrates such a complete and operative ion beam purification system and method of ion beam purification.

The illustrated view includes a sketch of the vacuum chamber walls. Note that both the structure of the magnetic pole arrangement of the yoked subassembly for the improved ion source and the wire coils of the magnetic analyzer apparatus can be mounted in the air atmosphere. Such an air environment placement capability makes for great simplification of manufacture and a longer duration of effective service.

Figure 13B:
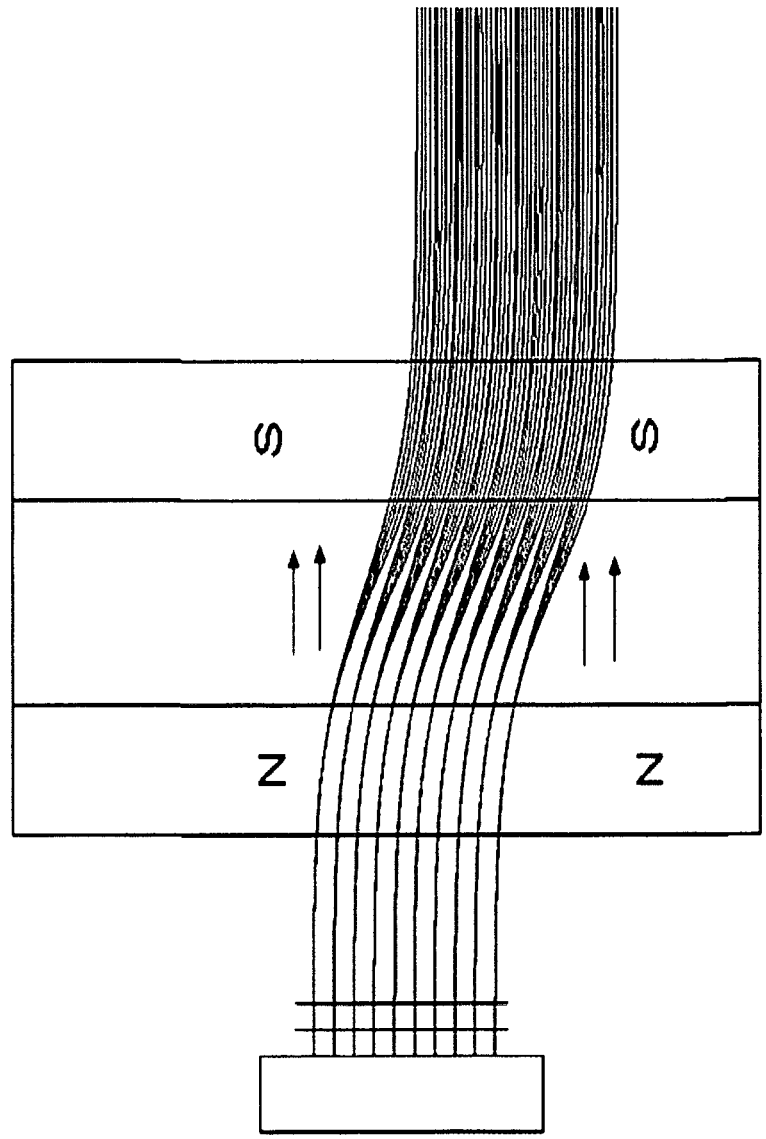

¶ FIG. 13b shows a projection in an orthogonal direction of the trajectories passing through this system, illustrating the complex three-dimensional trajectories that the ions undergo. For further information, see the co-filed application.

¶ The illustrated ion implantation system has ⅓ the linear footprint dimensions, and 1/20 the weight, of more conventional systems, and has the ability to deliver much greater throughput.

\* \* \*

The present invention is not to be restricted in form nor limited in scope except by the claims appended hereto.

What I claim is:

1. In an ion beam source able to produce a ribbon-shaped ion beam having a measurable breadth dimension which is at least ten times greater than its thickness dimension, the breadth and thickness dimensions of the produced beam being normal to the Z-axis direction of travel for the beam, and wherein the ion beam source includes
  (i) a closed arc discharge chamber including a discrete solid front wall which presents at least one exit aperture for ion beam egress, a discrete solid back wall, at least two laterally positioned and oppositely situated solid adjoining sidewalls, two discrete solid and oppositely placed contiguous endwalls, and an internal cavity of determinable volume and configuration, wherein the arc discharge chamber presents a predetermined width dimension which extends along the Y-axis, a set front-to-hack dimension which extends along the Z-axis, and an arbitrarily chosen fixed length dimension which extends along the X-axis and can vary in its measurable size from about 80 mm to about 3,000 mm,
  (ii) at least one thermionic cathode disposed within said internal cavity volume of said arc discharge chamber, each cathode terminal being able to emit a stream of moving primary electrons on-demand,
  (iii) a controlled orifice for introducing a gaseous substance into the internal cavity volume of the arc discharge chamber,
  (iv) at least one extraction electrode located externally to the exit aperture in the front wall of the arc discharge chamber, and
  (v) a remotely positioned source of electrical power having both a positive terminal and a negative terminal; the substantive structural improvement of:
an operative primary electron trap assembly able to generate and install at least one discernible quadrupole magnetic field on-demand within the internal cavity volume of the arc discharge chamber,
wherein said installed quadrupole magnetic field primary electron trap assembly causes
  ($\alpha$) a redirection of travel pathways for the moving primary electrons emitted by the cathode terminal in a direction away from the internal peripheral regions and marginal edges of the cavity volume near the two adjoining sidewalls and the back wall of the arc discharge chamber,
  ($\beta$) a redirecting of travel movements for the primary electrons towards the central spatial zone then existing in the approximate middle of the confined cavity volume of the arc discharge chamber, and
  ($\delta$) a distribution of the redirected primary electrons uniformly at the approximate middle of the confined cavity space over the length dimension distance of the arc discharge chamber, and
  wherein said primary electron trap assembly uses combined electric and magnetic fields of which no significant component is directed in the X-axis direction,
and
wherein said primary electron trap assembly comprises
  (a) at least one identifiable rod-shaped anode disposed upon the inner face surface of one laterally positioned adjoining sidewall of the arc chamber and extending over the length dimension of the adjoining sidewall in the X-axis direction within the cavity volume of the arc discharge chamber, said rod-shaped anode being immersed within and encompassed by said installed quadrupole magnetic field of high strength such that the lines of magnetic flux curve over and around each disposed rod-shaped anode, said curved magnetic flux lines being effective to block primary electrons moving within the cavity volume from reaching each disposed rod-shaped anode,
  (b) a magnetic field generating yoke subassembly lying at a preset distance adjacent to and surrounding the exterior faces and perimeter of at least three discrete three walls of the arc discharge chamber, said magnetic field generating yoke subassembly comprising a open yoke framework upon which at least three discrete magnetic pole constructs of alternating polarity lie disposed azimuthally about the X-axis and extend over the length dimension of the arc discharge chamber, said polarity-alternating multiple pole constructs collectively generating and installing a discernible quadrupole magnetic field within the dimensional confines of the internal cavity volume of the arc discharge chamber,
  wherein the field strength of said installed quadrupole magnetic field is weaker, but not a zero value, along the internal face surface of the front wall than at the internal face surfaces of the two oppositely situated adjoining sidewalls and back wall of the arc chamber, and
  wherein the strength of said quadrupole magnetic field falls to an effective zero value at a spatial location which exists forward of the cavity midline along a central plane aligned with the X-axis and lies medially over the exit aperture in the front wall of the arc chamber,
  (c) a thermionic cathode which is spatially located at the internal face surface of an endwall of the arc discharge chamber such that the primary electrons emitted by the cathode surround and engage the null value axis of effectively zero magnetic field strength then existing approximately at the cavity volume midline along a central plane aligned with the X-axis and extending medially adjacent to the exit aperture in the front wall of the arc chamber, and
  (d) an electrical connection between said spatially located thermionic cathode and the arc chamber which causes the potential of said located cathode to have a small positive value with respect to the potential of the arc discharge chamber.

2. An improved ion source assembly for producing a ribbon ion beam with an arbitrarily chosen breadth dimension ranging from about 80 millimeters to about 3,000 millimeters in size, the breadth and thickness dimensions of the beam being normal to the Z-axis direction of travel for the ion beam, said improved ion source assembly comprising
an arc discharge chamber suitable for the ionization of a gaseous substance into a plasma state, said arc discharge chamber including
  (i) a closed box structure including a discrete solid front wall which presents at least one exit aperture for ion beam egress, a discrete solid back wall, at least two laterally positioned and oppositely situated solid adjoining sidewalls, two discrete solid and oppositely placed contiguous endwalls, and an internal cavity of determinable volume and configuration, wherein said closed box presents a predetermined width dimension which extends along the Y-axis, a set depth dimension which extends along the Z-axis, and an arbitrarily chosen fixed length dimension which extends along the X-axis and can vary in its measurable size from about 80 mm to about 3,000 mm having a solid top wall, (ii) at least one identifiable rod-shaped anode disposed upon the inner face surface of one laterally positioned adjoining sidewall of the closed box, said rod-shaped anode lying substantially in parallel with and extending over the length dimension of said adjoining sidewall in the X-axis direction within the cavity volume of said closed box, and being biased at a positive potential with respect to said solid walls of said closed box, (iii) at least one thermionic cathode disposed within said cavity volume of said closed box, each said cathode terminal being able to emit a stream of moving primary electrons on-demand and having a potential value similar to that of said solid walls of said closed box, (iii) a controlled orifice for introducing a gaseous substance into the internal cavity volume of said closed box, (iv) at least one extraction electrode located externally adjacent to said exit aperture of said front wall in said closed box, each said extraction electrode acting on-demand to extract a flowing stream of charged ions as a ribbon shaped beam from cavity volume of said closed box, and (v) a remotely positioned source of electrical power having a positive terminal electrically joined to said rod-shaped anode and a negative terminal electrically joined to said thermionic cathode; and an operative primary electron trap assembly able to generate and install at least one discernible quadrupole magnetic field on-demand within the internal cavity volume of said arc discharge chamber, said primary electron trap assembly being comprised of a magnetic field generating yoke subassembly which can generate and install a multipole magnetic field of high strength on-demand within said cavity volume of said arc discharge chamber, wherein said magnetic field generating yoke subassembly (α) is a preformed shaped fitting which can be aligned with and be placed adjacently to surround the exterior surfaces of said solid back wall and said oppositely situated adjoining sidewalls of said closed box in said arc discharge chamber, (β) can generate and install a discernible multipole magnetic field within said cavity volume of said arc discharge chamber, wherein said installed multipole magnetic field has a dominant quadrupole component with a null value along the approximate center line of the cavity volume, and lies substantially parallel to the X-axis of said closed box, and wherein said installed multipole magnetic field is substantially uniform along the fixed length dimension of said closed box and presents a magnetic flux which is orthogonal to the X-axis of said arc discharge chamber and is symmetrical in the X-Z plane of said arc discharge chamber, (γ) presents a installed multipole magnetic field of high strength within said cavity volume of said closed box configured such that said rod-shaped anode becomes immersed within and encompassed by the lines of magnetic flux which curve over and around each disposed rod-shaped anode, said curved magnetic flux lines being effective to block primary electrons moving within the cavity volume from reaching each disposed rod-shaped anode, and a preformed partition barrier of fixed dimensions and configuration which serves at least as a proper orientation and alignment fitting for said magnetic field generating yoke subassembly adjacent to said arc discharge chamber, wherein said preformed barrier plate (a) presents an obverse surface having a pre-sized spatial recess which is dimensionally sufficient to receive and contain the exterior solid walls of said arc discharge chamber within an existing environment, and (b) provides a reverse surface having a plurality of pre-sized spatial recesses which are contoured to receive and hold a said magnetic field generating yoke subassembly in a properly aligned position and orientation within an existing environment.

3. An improved ion source assembly for producing a ribbon ion beam with an arbitrarily chosen breadth dimension ranging from about 80 millimeters to about 3,000 millimeters in size, the breadth and thickness dimensions of the beam being normal to the Z-axis direction of travel for the ion beam, said improved ion source assembly comprising an arc discharge chamber suitable for the ionization of a gaseous substance into a plasma state, said arc discharge chamber including (i) a closed box structure including a discrete solid front wall which presents at least one exit aperture for ion beam egress, a discrete solid back wall, at least two laterally positioned and oppositely situated solid adjoining sidewalls, two discrete solid and oppositely placed contiguous endwalls, and an internal cavity of determinable volume and configuration, wherein said closed box presents a predetermined width dimension which extends along the Y-axis, a set depth dimension which extends along the Z-axis, and an arbitrarily chosen fixed length dimension which extends along the X-axis and can vary in its measurable size from about 80 mm to about 3,000 mm having a solid top wall, (ii) at least one identifiable rod-shaped anode disposed upon the inner face surface of one laterally positioned adjoining sidewall of the closed box, said rod-shaped anode lying substantially in parallel with and extending over the length dimension of said adjoining sidewall in the X-axis direction within the cavity volume of said closed box, and being biased at a positive potential with respect to said solid walls of said closed box, (iii) at least one thermionic cathode disposed within said cavity volume of said closed box, each said cathode terminal being able to emit a stream of moving primary electrons on-demand and having a potential value similar to that of said solid walls of said closed box, (iii) a controlled orifice for introducing a gaseous substance into the internal cavity volume of said closed box, (iv) at least one extraction electrode located externally adjacent to said exit aperture of said front wall in said closed box, each said extraction electrode acting on-demand to extract a flowing stream of charged ions as a ribbon shaped beam from cavity volume of said closed box, and (v) a remotely positioned source of electrical power having a positive terminal electrically joined to said rod-shaped anode and a negative terminal electrically joined to said thermionic cathode; and an operative primary electron trap assembly able to generate and install at least one discernible quadrupole magnetic field on-demand within the internal cavity volume of said arc discharge chamber, said primary electron trap assembly being comprised of a magnetic field generating yoke subassembly which can generate and install a multipole magnetic field of high strength on-demand within said cavity volume of said arc discharge chamber, wherein said magnetic field generating yoke subassembly
  (α) is a preformed shaped fitting which can be aligned with and be placed adjacently to surround the exterior face surfaces of said solid hack wall and said oppositely situated adjoining sidewalls of said closed box in said arc discharge chamber,
  (β) can generate and install a discernible multipole magnetic field within said cavity volume of said arc discharge chamber, wherein said installed multipole magnetic field has a dominant quadrupole component with a null value along the approximate center line of the cavity volume, and lies substantially parallel to the X-axis of said closed box, and wherein said installed multipole magnetic field is substantially uniform along the fixed length dimension of said closed box and presents a magnetic flux which is orthogonal to the X-axis of said arc discharge chamber and is symmetrical in the X-Z plane of said arc discharge chamber,
  (γ) presents a installed multipole magnetic field of high strength within said cavity volume of said closed box configured such that said rod-shaped anode becomes immersed within and encompassed by the lines of magnetic flux which curve over and around each disposed rod-shaped anode, said curved magnetic flux lines being effective to block primary electrons moving within the cavity volume from reaching each disposed rod-shaped anode, and a preformed partition barrier of fixed dimensions and configuration which serves as an intervening fitting for proper orientation and alignment of said magnetic field generating yoke subassembly adjacent to said arc discharge chamber, wherein said preformed barrier plate
  (a) presents an obverse surface having multiple spatial recesses for positioning said magnetic field generating yoke subassembly in a proper orientation and aligned placement adjacent to said arc discharge chamber, and
  (b) provides a reverse surface contoured as a buttressing flange which supports said magnetic field generating yoke subassembly in aligned placement adjacent to said arc discharge chamber within an operating environment.

4. The improved ion source assembly of claim 1, 2 or 3 wherein said magnetic field generating yoke subassembly further comprises a shaped supporting open framework formed of ferromagnetic material upon which are disposed in sequential series three elongated ferromagnetic poles of alternating polarity.

5. The improved ion source assembly of claim 1, 2 or 3 wherein said magnetic field generating yoke subassembly further comprises a shaped supporting open framework formed of ferromagnetic material upon which are disposed in sequential series four elongated ferromagnetic poles of alternating polarity.

6. The improved ion source assembly of claim 4 wherein two of said disposed ferromagnetic poles are individually constructed as wire winding coils and said third disposed ferromagnetic pole is constructed as an elongated ferromagnetic shaft.

7. The improved ion source assembly of claim 4 wherein each said disposed ferromagnetic poles is constructed from permanent magnetic material.

8. The improved Ion source assembly of claim 2 or 3 wherein said preformed partition barrier further comprises multiple discrete water carrying conduits and cooling passageways.

9. The improved ion source assembly of claim 2 or 3 wherein said preformed partition barrier is fabricated of at least one heat absorbing metallic composition.

10. The improved ion source assembly of claim 1, 2 or 3 wherein said exit aperture for beam egress is a single parallel-edged slot.

11. The improved ion source assembly of claim 1, 2 or 3 wherein each said extraction electrode contains a single parallel-edged slot.

12. The improved ion source assembly of claim 1, 2 or 3 wherein each said thermionic cathode is a filament formed of tungsten wire and is directly heated by an electric current.

13. The improved ion source assembly of claim 1, 2 or 3 wherein
  each said thermionic cathode is a block formed of tungsten, is cut in an interdigitated pattern, and is directly heated by an electric current.

14. The improved ion source assembly of claim 1, 2 or 3 wherein each said thermionic cathode is a block formed of tungsten, and is indirectly heated by electron impact from a source located external to said arc discharge chamber.

15. The improved ion source assembly of claim 1, 2 or 3 further comprising an extraction electrode array selected from the group consisting of a triode electrode array and a tetrode electrode array.

16. The improved ion source assembly of claim 15
  wherein the exit aperture in the arc chamber includes a first extraction electrode, and each subsequent electrode is fabricated in two similar halves, and
  wherein which all the electrode halves on one side of the beam are mounted on insulators in a stack and attached to the ion source, and
  wherein all said extraction electrode halves on the other side of the beam are mounted on a similar stack of insulators and attached to the ion source,
  thereby ensuring that the electrode edges remain aligned and parallel over the full X-axis extent of the ribbon beam.

17. The improved ion source assembly of claim 1, 2 or 3 wherein the gas or vapor to be ionized is introduced at multiple orifices located along the X-axis and length dimension of said arc discharge chamber, and the individual flows of gas through each said orifice are adjusted in response to measurement of the beam current density at points in the beam downstream of each orifice, thereby allowing the uniformity of the resulting ion beam to be adjusted, and the non-uniformity minimized.

\* \* \* \* \*